(12) United States Patent
Wakizaka et al.

(10) Patent No.: US 7,396,588 B2
(45) Date of Patent: Jul. 8, 2008

(54) CURABLE COMPOSITION, VARNISH AND LAMINATE

(75) Inventors: Yasuhiro Wakizaka, Kawasaki (JP); Toshiyasu Matsui, Kawasaki (JP); Daisuke Uchida, Kawasaki (JP); Koichi Ikeda, Kawasaki (JP)

(73) Assignee: Zeon Corporation, Tokyo (JP)

( * ) Notice: Subject to any disclaimer, the term of this patent is extended or adjusted under 35 U.S.C. 154(b) by 0 days.

(21) Appl. No.: 11/598,766

(22) Filed: Nov. 14, 2006

(65) Prior Publication Data

US 2007/0060674 A1    Mar. 15, 2007

Related U.S. Application Data

(62) Division of application No. 10/398,284, filed on Apr. 10, 2003, now Pat. No. 7,160,609.

(51) Int. Cl.
| | |
|---|---|
| B32B 27/20 | (2006.01) |
| B32B 27/38 | (2006.01) |
| B32B 15/08 | (2006.01) |
| B32B 15/092 | (2006.01) |
| C08K 5/49 | (2006.01) |
| C08L 63/00 | (2006.01) |
| C09K 21/00 | (2006.01) |
| C09K 21/12 | (2006.01) |

(52) U.S. Cl. .................. 428/332; 252/601; 252/609; 428/413; 428/418; 428/901; 523/451; 524/115

(58) Field of Classification Search .......... 252/601, 252/609; 428/332, 413, 414, 415, 416, 417, 428/418, 474.4, 500, 522, 523, 901; 523/400, 523/440, 451, 452; 524/115, 136, 138
See application file for complete search history.

(56) References Cited

U.S. PATENT DOCUMENTS

| 3,892,577 | A | * | 7/1975 | Sugahara et al. ......... 106/14.12 |
| 6,130,282 | A | * | 10/2000 | Imahashi et al. ............ 524/436 |
| 6,136,973 | A | | 10/2000 | Suzuki et al. |
| 6,319,619 | B1 | | 11/2001 | Yamamoto et al. |
| 6,676,920 | B1 | | 1/2004 | Oishi et al. |

FOREIGN PATENT DOCUMENTS

| JP | 61-126091 | | 6/1986 |
| JP | 10-306081 | | 11/1998 |
| JP | 10-306082 | | 11/1998 |
| JP | 2000-095956 | | 4/2000 |
| JP | 02-255848 | | 10/2000 |
| JP | 2000-290490 | | 10/2000 |
| JP | 2000-303257 | | 10/2000 |
| JP | 2000-345034 | | 12/2000 |
| JP | 2001-98161 | | 4/2001 |
| WO | WO98/08898 | | 3/1998 |
| WO | WO 98/47968 | * | 10/1998 |
| WO | WO 00/35808 | * | 6/2000 |

* cited by examiner

Primary Examiner—Michael J Feely
(74) Attorney, Agent, or Firm—Edwards Angell Palmer & Dodge LLP

(57) ABSTRACT

A curable composition comprises an insulating resin and a halogen-free flame retardant. The halogen-free flame retardant has a particulate form, and whose primary particles have an average major axis from 0.01 to 5 μm, an aspect ratio of 5 or less, and the proportion of a major axis of more than 10 μm being at most 10% by number. A varnish comprises an insulating resin, a curing agent, a flame retardant and an organic solvent. The flame retardant is a flame retardant in particulate form surface-treated with a coupling agent, and the flame retardant particles present in the varnish have a secondary particle diameter of 30 μm or less.

9 Claims, No Drawings

CURABLE COMPOSITION, VARNISH AND LAMINATE

This application is a Divisional Application of U.S. Ser. No. 10/398,284 filed on Apr. 10, 2003, now U.S. Pat. No. 7,160,609. This application claims priorities under 35 USC 119, as set forth in U.S. Pat. No. 7,160,609.

TECHNICAL FIELD

The present invention relates to curable compositions and multilayer circuit boards, and more specifically relates to curable compositions showing good flame retardancy without containing halogen, having excellent electrical insulation and capable of forming electrical insulating layers having low dielectric constant, and multilayer circuit boards obtained by using the same.

Furthermore, the present invention relates to varnish for use in the production of insulation films, and more specifically relates to varnish showing good flame retardancy, having excellent electrical insulation and capable of forming electrical insulating layers having reduced variations in dielectric constant, insulation films obtained by using the same and laminates such as multilayer circuit boards having the insulation films as electrical insulating layers.

BACKGROUND ART

As electronic equipment becomes further miniaturized and multifunctional, higher density has been requested also for the circuit boards used in the electronic equipment.

For making the density of the circuit boards higher, the circuit boards are generally multilayered. The multilayer circuit board is typically obtained by laminating an electrical insulating layer (A2) on an inner layer board consisting of an electrical insulating layer (A1) and a conductor circuit (B1) formed on the surface thereof, forming a conductor circuit (B2) on the electrical insulating layer (A2), and further alternately laminating a number of electrical insulating layers and conductor circuits as necessary.

Formation of multilayered high-density wiring causes generation of heat in the board itself and the electronic devices themselves during operation. Flame retardants are generally formulated in the electrical insulating layers to prevent the ignition due to the heat generation.

Further, used boards are often disposed of by incineration. To the electrical insulating layers, for example, materials in which halogen-based flame retardants are formulated as disclosed in Japanese Patent Laid-Open No. 2-255848 have been used, thereby imparting flame retardancy. The materials in which halogen-based flame retardants are formulated generate halogen-based hazardous substances on burning. As problems of global environmental damage and warming have been closed up, use of the halogen-based flame retardants has been restricted. Thus, there is a need for a material having flame retardancy that is comparable or superior to conventional materials without generating halogen-based hazardous substances.

As halogen-free flame retardants, phosphorus-based flame retardants such as a salt of basic nitrogen-containing compound with phosphoric acid are known. Generally, the salt of basic nitrogen-containing compounds and phosphorus are obtained by reacting the basic nitrogen-containing compounds with phosphoric acid in the presence of a condensation agent and then baking the product. The obtained salt are needle-like or fiber-like particles. However, such phosphorus-based flame retardants are generally poor in flame retardancy compared with halogen-based flame retardants and have difficulty in adequately enhancing the flame retardancy of the electrical insulating layers for multilayer circuit boards.

In addition, use of flame retardants in particulate form may cause variations in electrical properties (dielectric constant) of the multilayer circuit boards due to moisture absorption.

DISCLOSURE OF THE INVENTION

It is an object of the present invention to provide curable compositions showing good flame retardancy without containing halogen, having excellent electrical insulation and capable of forming electrical insulating layers with low dielectric constant, and multilayer circuit boards obtained by using the same.

It is another object of the present invention to provide insulation films showing good flame retardancy and having stable electrical properties and laminates comprising the same.

It is a further object of the present invention to provide flame retardant slurries, varnishes comprising insulating resins and flame retardants, films or sheets using the varnishes, and methods for producing them.

The inventors have diligently studied to achieve the objects described above and found that the above objects are achievable by using the electrical insulating layers prepared by curing the curable compositions comprising insulating resins and halogen-free flame retardants with a specific form for multilayer circuit boards.

Further, the inventors have found that electrical insulating layers having reduced variations in dielectric constant due to moisture absorption or the like can be obtained by using the flame retardants prepared by bringing flame retardants in particulate form into contact with coupling agents to treat the surface.

The present invention has been completed based on these findings.

The present invention provides a curable composition comprising an insulating resin and a halogen-free flame retardant whose primary particles have an average major axis from 0.01 to 5 μm, an aspect ratio of 5 or less, and the proportion of a major axis of more than 10 μm being at most 10% by number.

In addition, the present invention provides a varnish comprising an insulating resin, a curing agent, a flame retardant and an organic solvent, wherein the flame retardant is a flame retardant in particulate form surface-treated with a coupling agent and the flame retardant particles present in the varnish have a secondary particle diameter of 30 μm or less.

Further, the present invention provides moldings obtained by using the curable composition or varnish and insulation films prepared by curing the moldings.

Various aspects of the present invention will be described further in detail in accordance with the following detailed description and appended claims.

BEST MODE FOR CARRYING OUT THE INVENTION

1. Insulating Resins

The insulating resins used in the present invention include cycloaliphatic olefin polymers, epoxy resins, polyamide resins, phenol resins, maleimide resins, acrylic resins, diallyl phthalate resins, triazine resins, aromatic polyether polymers, polyester resins, benzocyclobutene polymers, cyanate ester polymers, liquid crystal polymers, and polyimide resins. These insulating resins may be used singly or in combination.

Among them, cycloaliphatic olefin polymers, epoxy resins, polyamide resins, aromatic polyether polymers, benzocyclobutene polymers, cyanate ester polymers, polyimide resins, and liquid crystal polymers are preferred; cycloaliphatic olefin polymers, epoxy resins, polyamide resins, aromatic polyether polymers and liquid crystal polymers are more preferred; and cycloaliphatic olefin polymers, epoxy resins and polyamide resins are most preferred.

Cycloaliphatic olefin polymers are polymers of unsaturated hydrocarbons having cycloaliphatic structure (that is, cycloaliphatic olefins). The cycloaliphatic structure includes cycloalkane structure, cycloalkene structure and the like, and cycloalkane structure is preferred in terms of mechanical strengths, heat resistance and the like. The cycloaliphatic structure may be either monocyclic or polycyclic (such as condensed polycyclic, bridged ring, or a combination thereof).

The number of carbon atoms composing the cycloaliphatic structure is, but not limited to, in the range generally from 4 to 30, preferably from 5 to 20 and more preferably from 5 to 15. Such cycloaliphatic olefins are preferably used to easily obtain cycloaliphatic olefin polymers having highly balanced properties including mechanical strengths, heat resistance and moldability.

The percentage of the cycloaliphatic olefin-derived repeating unit in the cycloaliphatic olefin polymers is, appropriately selected depending on intended use, generally from 30 to 100% by weight, preferably from 50 to 100% by weight, more preferably from 70 to 100% by weight. Excessively small percentage of the cycloaliphatic olefin-derived repeating unit may not be good due to poor heat resistance. The cycloaliphatic olefin polymer used in the present invention is generally a thermoplastic resin in itself.

Cycloaliphatic olefin polymers preferably have polar groups. The polar groups may include a hydroxyl group, a carboxyl group, an alkoxy group, an epoxy group, a glycidyl group, an oxycarbonyl group, a carbonyl group, an amino group, an ester group, and a carboxylic anhydride. A carboxyl group and a carboxylic anhydride are preferred among them.

Cycloaliphatic olefin polymers may be obtained, typically, by subjecting cycloaliphatic olefins to addition polymerization or ring-opening polymerization and hydrogenating the unsaturated bond portions of the resultant polymers as necessary, or by subjecting aromatic olefins to addition polymerization and hydrogenating the aromatic ring portions of the resultant polymers.

The cycloaliphatic olefin polymers having polar groups may be obtained, for example, 1) by introducing polar groups into cycloaliphatic olefin polymers by modification reaction, 2) by copolymerizing monomers including polar groups as copolymerization components, or 3) by copolymerizing monomers including polar groups such as an ester group as copolymerization components and then eliminating the ester group or the like by hydrolysis or the like. In the present invention, the polar-group containing cycloaliphatic olefin polymers obtained by the modification process of 1) is preferred.

The cycloaliphatic olefins used for obtaining the cycloaliphatic olefin polymers include norbornene monomers such as bicyclo[2.2.1]-hept-2-ene (trivial name "norbornene"), 5-methyl-bicyclo[2.2.1]-hept-2-ene, 5,5,-dimethyl-bicyclo[2.2.1]-hept-2-ene, 5-ethyl-bicyclo[2.2.1]-hept-2-ene, 5-butyl-bicyclo[2.2.1]-hept-2-ene, 5-hexyl-bicyclo[2.2.1]-hept-2-ene, 5-octyl-bicyclo[2.2.1]-hept-2-ene, 5-octadecyl-bicyclo[2.2.1]-hept-2-ene, 5-ethylidene-bicyclo[2.2.1]-hept-2-ene, 5-methylidene-bicyclo[2.2.1]-hept-2-ene, 5-vinyl-bicyclo[2.2.1]-hept-2-ene, 5-propenyl-bicyclo[2.2.1]-hept-2-ene, 5-methoxy-carbonyl-bicyclo[2.2.1]-hept-2-ene, 5-cyano-bicyclo[2.2.1]-hept-2-ene, 5-methyl-5-methoxycarbonyl-bicyclo[2.2.1]-hept-2-ene, 5-ethoxycarbonyl-bicyclo[2.2.1]-hept-2-ene, bicyclo[2.2.1]-hept-5-enyl-2-methylpropionate, bicyclo[2.2.1]-hept-5-enyl-2-methyloctanate, bicyclo[2.2.1]-hept-2-ene-5,6-dicarboxylic anhydride, 5-hydroxymethylbicyclo[2.2.1]-hept-2-ene, 5,6-di(hydroxymethyl)-bicyclo[2.2.1]-hept-2-ene, 5-hydroxy-i -propylbicyclo[2.2.1]-hept-2-ene, 5,6-dicarboxy-bicyclo[2.2.1]-hept-2-ene, bicyclo[2.2.1]-hept-2-ene-5,6-dicarboxylic acid imide, 5-cyclopentyl-bicyclo[2.2.1]-hept-2-ene, 5-cyclohexyl-bicyclo[2.2.1]-hept-2-ene, 5-cyclohexenyl-bicyclo[2.2.1]-hept-2-ene, 5-phenyl-bicyclo[2.2.1]-hept-2-ene, tricyclo[4.3.0.1$^{2,5}$]deca-3,7-diene (trivial name "dicyclopentadiene"), tricyclo[4.3.0.1$^{2,5}$]dec-3-ene, tricyclo[4.4.0.1$^{2,5}$]undeca-3,7-diene, tricyclo[4.4.0.1$^{2,5}$]undeca-3,8-diene, tricyclo[4.4.0.1$^{2,5}$]undeca-3-ene, tetracyclo[7.4.0.1$^{10,13}$.0$^{2,7}$]-trideca-2,4,6-11-tetraene (another name "1,4-methano-1,4,4a,9a-tetrahydrofluorene"), tetracyclo[8.4.0.1$^{11,14}$.0$^{3,8}$]-tetradeca-3,5,7,12-11-tetraene (another name "1,4-methano-1,4,4a,5,10,10a-hexahydroanthracene"), tetracyclo[4.4.0.1$^{2,5}$.1$^{7,10}$]-dodec-3-ene (trivial name "tetracyclododecene"), 8-methyl-tetracyclo[4.4.0.1$^{2,5}$.1$^{7,10}$]-dodec-3-ene, 8-ethyl-tetracyclo[4.4.0.1$^{2,5}$.1$^{7,10}$]-dodec-3-ene, 8-methylidene-tetracyclo[4.4.0.1$^{2,5}$.1$^{7,10}$]-dodec-3-ene, 8-ethylidene-tetracyclo[4.4.0.1$^{2,5}$.1$^{7,10}$]-dodec-3-ene, 8-vinyl-tetracyclo[4.4.0.1$^{2,5}$.1$^{7,10}$]-dodec-3-ene, 8-propenyl-tetracyclo[4.4.0.1$^{2,5}$.1$^{7,10}$]-dodec-3-ene, 8-methoxycarbonyl-tetracyclo[4.4.0.1$^{2,5}$.1$^{7,10}$]-dodec-3-ene, 8-methyl-8-methoxycarbonyl-tetracyclo[4.4.0.1$^{2,5}$.1$^{7,10}$]-dodec-3-ene, 8-hydroxymethyl-tetracyclo[4.4.0.1$^{2,5}$.1$^{7,10}$]-dodec-3-ene, 8-carboxy-tetracyclo[4.4.0.1$^{2,5}$.1$^{7,10}$]-dodec-3-ene, 8-cyclopentyl-tetracyclo[4.4.0.1$^{2,5}$.1$^{7,10}$]-dodec-3-ene, 8-cyclohexyl-tetracyclo[4.4.0.1$^{2,5}$.1$^{7,10}$]-dodec-3-ene, 8-phenyl-tetracyclo[4.4.0.1$^{2,5}$.1$^{7,10}$]-dodec-3-ene, pentacyclo[6.5.1.1$^{3,6}$.0$^{2,7}$.0$^{9,13}$]pentadeca-3,10-diene, pentacyclo[7.4.0.1$^{3,6}$.1$^{10,13}$.0$^{2,7}$]-pentadeca-4,11-diene, tetracyclo[6.5.0.1$^{2,5}$.0$^{8,13}$]trideca-3,8,10,12-tetraene, tetracyclo[6.6.0.1$^{2,5}$.1$^{8,13}$]tetradeca-3,8,10,12-tetraene.

In addition, the cycloaliphatic olefins include monocyclic cycloalkenes such as cyclobutene, cyclopentene, cyclohexene, 3,4-dimethylcyclopentene, 3-methylcyclohexene, 2-(2-methylbutyl)-1-cyclohexene, cyclooctene, 3a,5,6,7a-tetrahydro-4,7-methano-1H-indene, cycloheptene; vinyl cycloaliphatic hydrocarbon monomers such as vinylcyclohexene and vinylcyclohexane; and cycloaliphatic conjugated diene monomers such as cyclopentadiene and cyclohexandiene.

Aromatic olefins include styrene, α-methylstyrene, and divinylbenzene.

Cycloaliphatic olefins and aromatic olefins may be used singly or in combination.

Cycloaliphatic olefin polymers may include those obtained by copolymerizing cycloaliphatic olefins and/or aromatic olefins with monomers copolymerizable therewith.

The monomers copolymerizable with cycloaliphatic olefins or aromatic olefins include ethylene; α-olefins having from 3 to 20 carbon atoms such as propylene, 1-butene, 1-pentene, 1-hexene, 3-methyl-1-butene, 3-methyl-1-pentene, 3-ethyl-1-pentene, 4-methyl-1-pentene, 4-methyl-1-hexene, 4,4-dimethyl-1-hexene, 4,4-dimethyl-1-pentene, 4-ethyl-1-hexene, 3-ethyl-1-hexene, 1-octene, 1-decene, 1-dodecene, 1-tetradecene, 1-hexadenece, 1-octadecene, and 1-eicosene; non-conjugated dienes such as 1,4-hexadiene, 4-methyl-1,4-hexadiene, 5-methyl-1,4-hexadiene, and 1,7- octadiene; and conjugated dienes such as butadiene and isoprene; and the like. These monomers may be used singly or in combination. Among these monomers, vinyl compounds such as ethylene and α-olefins are preferred.

A method for polymerizing cycloaliphatic olefins and aromatic olefins and a method of hydrogenation performed as necessary are not particularly limited, but may be performed in accordance with well-known methods.

Examples of the cycloaliphatic olefin polymers include (1) ring-opening polymers of norbornene monomers and their hydrogenated products, (2) addition polymers of norbornene monomers, (3) addition polymers of norbornene monomers and vinyl compounds, (4) monocyclic cycloalkene polymers, (5) cycloaliphatic conjugated diene polymers and their hydrogenated products, (6) vinyl cycloaliphatic hydrocarbon polymers and their hydrogenated products, and (7) aromatic ring hydrogenated products of aromatic olefin polymers. Each polymer from the above (2) to (4) may also be hydrogenated as necessary when substituted groups or unsaturated bonds in polycyclic structures are present.

Among them, ring-opening polymers of norbornene monomers and their hydrogenated products, addition polymers of norbornene monomers, addition polymers of norbornene monomers and vinyl compounds, and aromatic ring hydrogenated products of aromatic olefin polymers are preferred, and hydrogenated products of ring-opening polymers of norbornene monomers are particularly preferred.

The cycloaliphatic olefin polymers may be used singly or in combination.

Among the cycloaliphatic olefin polymers, ring-opening polymers of norbornene monomers and their hydrogenated products are classified as the different polymers from the polyolefin resins obtained by copolymerizing olefins expressed by $C_nH_{2n}$ due to the difference of their structures.

The cycloaliphatic olefin polymers are not particularly limited by their molecular weight. The molecular weight of the cycloaliphatic olefin polymers ranges generally from 1,000 to 1,000,000, preferably from 5,000 to 500,000, more preferably from 10,000 to 250,000, expressed as weight average molecular weight (Mw) in terms of polystyrene as measured by gel permeation chromatography (GPC) with cyclohexane or toluene as solvent. The weight average molecular weight (Mw) of the cycloaliphatic olefin polymers within this range suitably balances heat resistance, smoothness of the surface of moldings and the like.

The molecular weight distribution of the cycloaliphatic olefin polymers is generally 5 or less, preferably 4 or less, more preferably 3 or less, when expressed as the ratio (Mw/Mn) of weight average molecular weight (Mw) and number average molecular weight (Mn) as measured by GPC with cyclohexane or toluene as solvent.

The above described ranges of the weight average molecular weight (Mw) and molecular weight distribution (Mw/Mn) and a method for measuring them are suitably applicable to the above described norbornene polymers (1) to (3). In the case of the cycloaliphatic olefin polymers whose weight average molecular weight or molecular weight distribution cannot be measured by the above method, those having melt viscosity or polymerization degree to the extent capable of forming rein layers by conventional melt processing may be used.

The glass transition temperature of the cycloaliphatic olefin polymers may be appropriately selected depending on intended use, and generally 50° C. or higher, preferably 70° C. or higher, more preferably 100° C. or higher, most preferably 125° C. or higher.

As epoxy resins, various epoxy resins such as a glycidylether type, a glycidylester type, a glycidylamine type, and a cycloaliphatic type may be used. The glycidylether-type epoxy resins include various epoxy resins such as a bisphenol A type, a phenol novolac type, an orthocresol type, a polyhydric phenol type, a biphenyl type, and a dicyclopentadiene type.

Polyamide resins include nylon-6, nylon-66, nylon-610, nylon-612, nylon-11, nylon-12, nylon-46, nylon-MXD6, copolymer nylon, and blended products thereof.

Aromatic polyether polymers are polyethers having aromatic rings, and may be typically obtained by reacting 2,6-disubstituted phenols such as 2,6-dimethylphenol and 2,6-diphenylphenol with oxygen under the presence of basic copper(II) salt such as a copper(II) amine complex. The aromatic polyether polymers include polyphenylene ether, modified polyphenylene ether and the like. Among them, the modified polyphenylene ether having a small dielectric constant and dielectric loss tangent is suitable.

Preferred liquid crystal polymers are thermoplastic liquid crystal polymers such as polymers of aromatic or aliphatic dihydroxy compounds, polymers of aromatic or aliphatic dicarboxylic acids, polymers of aromatic hydroxycarboxylic acids, aromatic diamines, and polymers of aromatic hydroxyamines or aromatic aminocarboxylic acids.

2. Curing Agent

Curing agents for use in the present invention include, but not limited to, for example, ionic curing agents, radical curing agents, and curing agents having both ionic and radical properties. Preferred curing agents are ionic curing agents in terms of insulating resistance, heat resistance, chemical resistance, and compatibility with cycloaliphatic olefin polymers. Among them, nitrogen-based curing agents containing nitrogen atoms are preferred, and the nitrogen-based curing agents free from halogen atoms are more preferred.

The nitrogen-based curing agents include, for example, aliphatic polyamines such as hexametylenediamine, triethylenetetramine, diethylenetriamine, tetraethylenepentamine; diaminocyclohexane, 3(4),8(9)-bis(aminomethyl)tricyclo[5.2.1.0$^{2,6}$]decane; cycloaliphatic polyamines such as 1,3-(diaminomethyl)cyclohexane, menthene diamine, isophorondiamine N-aminoethyl pyperazine, bis(4-amino-3-methylcyclohexyl)methane, bis(4-aminocyclohexyl) methane; aromatic polyamines such as 4,4'-diaminodiphenylether, 4,4'-diaminodiphenylmethane, α,α'-bis(4-aminophenyl)-1,3-diisopropylbenzene, α,α'-bis(4-aminophenyl)-1,4-diisopropylbenzene, 4,4'-diaminodiphenylsulfone, meta-phenylenediamine, meta-xylilenediamine; polyamides such as nylon-6, nylon-66, nylon-610, nylon-11, nylon-612, nylon-12, nylon-46, methoxymethylated polyamides, polyhexamethylenediamine terephthalamide, polyhexamethylene isophthalamide; isocyanates such as hexamethylene diisocyanate, toluilene diisocyanate; isocyanuric acid; triallyl cyanurate; 1-allyl isocyanurate, 1,3-diallyl isocyanurate, 1,3-diallyl-5-benzyl isocyanurate, triallyl isocyanurate, 1-allyl-3,5-dibenzyl isocyanurate; compounds having isocyanurate structure such as 1-allyl-3,5-diglycidyl isocyanurate, 1,3-diallyl-5-glycidyl isocyanurate, triglycidyl isocyanurate, 1,3-diallyl-5-(2-hydroxy-3-butoxypropyl)-1,3,5-triazine-2,4,6(1H,3H,5H)-trione, and 1,3-diallyl-5-(2-hydroxy-3-phenoxypropyl)-1,3,5-triazine-2,4,6(1H,3H,5H)-trione; glycidyl amine-type epoxy compounds; and the like.

Among them, nitrogen-based curing agents including allyl groups and epoxy groups are preferred, and particularly preferred are halogen-free isocyanurate-based curing agents including an allyl group and an epoxy group such as 1-allyl-3,5-diglycidyl isocyanurate, 1,3-diallyl-5-glycidyl isocyanurate.

The nitrogen-based curing agents can be used singly or in combination, and the loading ratio ranges generally from 5 to 150 parts by weight, preferably from 15 to 110 parts by weight, more preferably from 30 to 100 parts by weight, per 100 parts by weight of insulating resins. However, when using polyamide resins (nylon) as the nitrogen-based curing agents, the polyamide resins are not classified as the insulating resins.

Other than these nitrogen-based curing agents, nitrogen-free multivalent epoxy compounds, curing agents for use in general purposes and the like may be used, such as, for example, bisazide compounds, acid anhydrides, dicarboxylic acid compounds, diol compounds, triol compounds, polyhydric phenol compounds, glycidylether-type epoxy compounds, cycloaliphatic epoxy compounds, and glycidylester-type epoxy compounds.

Curing agents can be used singly or in combination, and the loading ratio ranges generally from 5 to 150 parts by weight, preferably from 15 to 110 parts by weight, more preferably from 30 to 100 parts by weight per 100 parts by weight of insulating resins.

To promote curing reaction between insulating resins and curing agents, curing accelerators and curing aids can be used.

Curing accelerators suitably include, but not limited to, for example, tertiary amine compounds and trifluorinated boron complex compounds. Among them, use of tertiary amine compounds improves lamination properties to microscopic wiring, insulating resistance, heat resistance and chemical resistance.

Examples of tertiary amine compounds include acyclic tertiary amine compounds such as benzyldimethylamine, triethanolamine, triethylamine, tributylamine, tribenzylamine, dimethylformamide; compounds such as pyrazoles, pyridines, pyrazines, pirimidines, indazoles, quinolines, isoquinolines, imidazoles, triazoles and the like. Among them, imidazoles are preferred, and substituted imidazoles are most preferred.

Examples of substituted imidazole compounds include alkyl substituted imidazole compounds such as 2-ethylimidazole, 2-ethyl-4-methylimidazole, bis-2-ethyl-4-methylimidazole, 1-methyl-2-ethylimidazole, 2-isopropylimidazole, 2,4-dimethylimidazole, 2-heptadecylimidazole; imidazole compounds substituted with a hydrocarbon group including a ring structure such as an aryl group or an aralkyl group such as 2-phenylimidazole, 2-phenyl-4-methylimidazole, 1-benzyl-2-methylimidazole, 1-benzyl-2-ethylimidazole, 1-benzyl-2-phenylimidazole, benzimidazole, 2-ethyl-4-methyl-1-(2'-cyanoethyl)imidazole, 2-ethyl-4-methyl-1-[2'-(3",5"-diaminotriazinyl)ethyl]imidazole; and the like. Among them, imidazoles having substituted groups including a ring structure are preferred in terms of compatibility with cycloaliphatic olefin polymers, and 1-benzyl-2-phenylimidazole is most preferred.

Curing accelerators are used singly or in combination. The loading of the curing accelerators is appropriately selected depending on intended use, and generally from 0.001 to 30 parts by weight, preferably from 0.01 to 10 parts by weight, more preferably from 0.03 to 5 parts by weight, per 100 parts by weight of insulating resins.

Curing aids are used as necessary. Curing aids include, for example, oxime-nitroso curing aids such as quinonedioxime, benzoquinonedioxime, and p-nitrosophenol; maleimide curing aids such as N,N-m-phenylene bismaleimide; allyl curing aids such as diallyl phthalate, triallyl cyanulate and triallyl isocyanulate; methacrylate curing aids such as ethyleneglycol dimethacrylate and trimethylolpropane trimethacrylate; vinyl curing aids such as vinyl toluene, ethylvinylbenzene and divinylbenzene; and the like. Other than these, peroxides acting as curing aids to the curing agents having an allyl group can also be used.

Peroxides can be used as radical curing agents or curing aids. Peroxides include, for example, benzoyl peroxide, dichlorbenzoyl peroxide, dicumyl peroxide, di-tert-butyl peroxide, 2,5-dimethyl-2,5-(peroxide benzoate)-3-hexyne, 1,4-bis(tert-butyl peroxyisopropyl)benzene, lauroyl peroxide, tert-butyl peracetate, 2,5-dimethyl-2,5-di(tert-butyl peroxy)hexyne-3,2,5-dimethyl-2,5-di(tert-butyl peroxy)hexane, tert-butyl perbenzoate, tert-butyl perphenyl acetate, tert-butyl perisobutyrate, tert-butylper-sec-octoate, tert-butyl perpivalate, cumyl perpivalate, tert-butyl perdiethylacetate, methyl ethyl ketone peroxide, cyclohexanone peroxide, 1,1-bis(tert-butyl peroxy)-3,3,5-trimethylcyclohexane, 2,2-bis(tert-butyl peroxy)butane, tert-butyl hydroperoxide, 2,5-dimethylhexane-2,5-dihydroperoxide, dicumyl peroxide, 2,5-dimethyl-2,5-di(tert-butyl peroxy)hexyne-3, α,α'-bis(tert-butyl peroxy-m-isopropyl)benzene, octanoyl peroxide, isobutyryl peroxide, and peroxydicarbonate. Among these peroxides, those containing no halogen elements are preferred.

The loading of the peroxides is generally from 0.1 to 40 parts by weight, preferably from 1 to 20 parts by weight, per 100 parts by weight of insulating resins. Those having the peroxide loading within this range are excellent in lamination properties for embedding wiring and the like.

3. Flame Retardant

Flame retardants (flame retardancy-imparting agent) for use in the present invention may include those generally used as flame retardants for synthetic resins, and suitably include those in particulate form in insulating resins or varnish. Flame retardants are preferably surface-treated with coupling agents. The surface treatment is typically performed by bringing the flame retardants into contact with coupling agents.

The average major axis of the primary particles of the flame retardants used in the present invention is generally from 0.01 to 5 μm, preferably from 0.05 to 3 μm. The average aspect ratio (that is, average major axis/average minor axis) of the flame retardants is generally 5 or less, preferably 3 or less. The flame retardants desirably include particles having a major axis of more than 10 μm in generally 10% or less, preferably 5% or less, most preferably 1% or less by number. Use of the flame retardants meeting such particulate form characteristics can provide moldings such as multilayer circuit boards, films and sheets, having high flame retardancy and excellent electrical insulation.

Flame retardants preferably comprise the flame retardants that do not generate hazardous substances such as halogen or halogen-containing substances on burning, in terms of environmental protection. Thus, the present invention preferably employs the flame retardants comprising compounds that do not include halogen, that is, halogen-free flame retardants.

Examples of the halogen-free flame retardants include antimony compounds such as antimony trioxide, antimony pentoxide, and sodium antimonate; other inorganic flame retardants such as aluminum hydroxide, magnesium hydroxide, zinc borate, guanidine sulfamate, zirconium compounds, molybdenum compounds, tin compounds; phosphorus-containing compounds such as triphenyl phosphate, tricresyl phosphate, trixylenyl phosphate, trimethyl phosphate, triethyl phosphate, tributyl phosphate, trioctyl phosphate, tributoxyethyl phosphate, octyldiphenyl phosphate, cresyldiphenyl phosphate, xylenyldiphenyl phosphate, resorcinol bis (diphenyl)phosphate, 2-ethylhexyl diphenyl phosphate, dimethyl methylphosphate, triallyl phosphate, diethyl bis(hydroxyethyl)aminomethyl phosphate, triallyl phosphate, tris (3-hydroxypropyl)phosphine oxide, glycidyl-α-methyl-β-di (butoxy)phosphinyl propionate, dibutyl hydroxymethylphosphonate, dimethyl methylphosphonate, aromatic condensed phosphates, di[ethoxy-bis-(2-hydroxyethyl)-aminomethyl]phosphate, di(polyoxyethylene)-hydroxymethyl phosphonate, ammonium polyphosphate, butyl pyrophosphate, butyl acid phosphate, butoxyethyl acid phosphate, 2-ethylhexyl acid phosphate, diethylphenyl phosphonate, dimethylphenyl phosphonate, di(isopropyl)-N,N-bis(2-hydroxyethyl)aminomethyl phosphonate, dibutylbis(2-hydroxypropyl)pyrophosphonate, phenyl phosphinic acid, melamine polyphosphate, melamine melame meleme polyphosphate complex salt, red phosphorus, guanidine phosphate, guanyl urea phosphate, polyphosphoryl sulfate, diphenylphosphoryl-2-propenylamide, diphenylphosphoryl-2-hydroxyethylamide, diphenylphosphoryl-di(2-hydroxyethyl)amide, diphenylphosphoryl-di-2-cyanoethylamide, diphenylphosphoryl-p-hydroxyphenylamide, diphenylphosphoryl-m-hydroxyphenylamide, diphenylphosphoryl-cyclohexylamide; phenylphosphoryl-di-N,N-phenylmethylamide, phenylphosphoryl-di-N-cyclohexylamide, di(butoxy)phosphinyl propylamide, 1,3,5-triazine derivative salt of polyacids containing phosphorus, sulfur and oxygen (refer to Japanese Patent Laid-Open No. 10-30608 and the like); and the like. Among them, phosphorus-containing compounds (phosphorus flame retardants) are preferred as halogen-free flame retardants, and phosphorus flame retardants comprised of a salt of basic nitrogen-containing compound and phosphoric acid are most preferred.

The salt of basic nitrogen-containing compounds and phosphoric acid may be, typically, obtained by undergoing a thermal condensation reaction between phosphoric acid sources such as ammonium orthophosphate, orthophophoric acid, condensed phosphoric acid, phosphoric anhydride, urea phosphate or mixtures thereof and nitrogen sources such as melamine, dicyancyanamid, guanidine, guanyl urea or mixtures thereof under the presence of condensation agents such as urea, urea phosphate (this is used also as a phosphoric acid source) and mixtures thereof and then by burning the resultant condensation products.

Thus obtained phosphorus flame retardant particles have a median diameter of generally 10 μm or less and have needle-like or whisker-like form. In addition, these phosphorus flame retardant particles include, in most case, particles having a major axis of more than 10 μm in a percentage of 20% or more, and generally have an average major axis from 10 to 20 μm.

The flame retardant for use in the present invention preferably comprises a halogen-free flame retardant whose primary particles have an average major axis from 0.01 to 5 μm, an aspect ratio of 5 or less, and the proportion of a major axis of more than 10 μm being at most 10% by number. Therefore, the flame retardants comprising the salt of basic nitrogen-containing compounds and phosphoric acid in needle-like or whisker-like coarse particles are desirably wet ground in a mixed organic solvent consisting of a polar organic solvent and a non-polar organic solvent to finely divide particle sizes, thereby adjusting the particulate form characteristics into a preferable range.

Polar organic solvents are those having polar groups such as a halogen group, a carbonyl group, a carboxyl group, a hydroxy group, an ester group, an amino group and an amide group. More specifically, the polar organic solvents include, for example, halogenated hydrocarbon organic solvents such as chlorobenzene, dichlorobenzene and trichlorobenzene; ketone organic solvents such as methyl ethyl ketone, methyl isobutyl ketone, cyclopentanone and cyclohexanone; and the like. Among them, ketone organic solvents are preferred.

Non-polar organic solvents are hydrocarbon compounds having no polar groups and include, for example, aromatic hydrocarbons such as toluene, xylene, ethylbenzene and trimethylbenzene; aliphatic hydrocarbons such as n-pentane, n-hexane and n-heptane; cycloaliphatic hydrocarbons such as cyclopentane and cyclohexane; and the like. Among them, aromatic hydrocarbons are preferred.

The mixture ratio of non-polar organic solvents and polar organic solvents may be selected appropriately, and ranges generally from 5:95 to 95:5, preferably from 10:90 to 90:10, more preferably from 20:80 to 80:20, by weight ratio.

Too large weight ratio of non-polar organic solvents may cause aggregation of the salt of nitrogen-containing compounds and phosphoric acid at the grinding, making it difficult to adjust the particulate form into desirable one. On the other hand, too small weight ratio of the non-polar organic solvents may cause secondary aggregation, impairing the dispersibility into insulating resins.

The loading of the flame retardants may be selected appropriately depending on intended use, and is generally from 0.1 to 50 parts by weight, preferably from 1 to 40 parts by weight, more preferably from 5 to 35 parts by weight, per 100 parts by weight of insulating resins.

4. Coupling Agent

Contact of flame retardants with coupling agents causes the coupling agents to be physically or chemically bonded (including adsorption) to the surface of the flame retardants to reduce the aggregation properties of the flame retardants, improving the dispersibility in varnish or insulating resins.

Coupling agents include silane compounds, metal ester compounds, metal complex compounds, and metal chelate compounds. Among them, metal chelate compounds are preferred in terms of stability in an organic solvent.

The metal chelate compounds are those in which metal and organic compound residues have formed a chelate. The metal chelate compounds preferably comprise those in which a part of alkoxy groups in the alkoxides of the metals such as aluminum, titanium, tin and zinc is substituted with organic compound residues such as ester residues, carboxylic acid residues and other alkoxy groups (alcohol residues). Aluminum chelate compounds or titanium chelate compounds, which are metal chelate compounds having aluminum or titanium, are preferred since they are stable in a dispersing solvent.

The structure of the metal chelate compounds is not limited, and may include any structure such as a monomer type or a polymer type.

The aluminum chelate compounds include fatty acid aluminum chelate compounds such as, for example, diisopropoxyaluminum monooleyl acetoacetate, monoisopropoxyaluminum bisoleyl acetoacetate, monoisopropoxyaluminum monomethacrylate monooleyl acetoacetate, monoisopropoxyaluminum monooleate monoethyl acetoacetate, monoisopropoxyaluminum monoethyl acetoacetate monooleyl acetoacetate, diisopropoxyaluminum monolauryl acetoacetate, diisopropoxyaluminum monostearyl acetoacetate, diisopropoxyaluminum monoisostearyl acetoacetate, monoisopropoxyaluminum bisoleyl acetoacetate, monoisopropoxyaluminum monomethacrylate monooleyl acetoacetate, monoisopropoxyaluminum monooleate monoethyl acetoacetate, monoisopropoxyaluminum monooleyl alkoxide monoethyl acetoacetate, monoisopropoxyaluminum monorosinate monolauryl acetoacetate, diisopropoxyaluminum monoabiethyl acetoacetate, and monoisopropoxyaluminum mono-N-lauroyl-β-alanate monolauryl acetoacetate.

The titanium chelate compounds include, for example, fatty acid titanium chelate compounds such as isopropyl trioctanoyl titanate, isopropyl dimethacryl isostearoyl titanate, isopropyl trisstearoyl titanate, isopropyl trisisostearoyl titanate, isopropyl diacryl titanate, dicumylphenyl oxyacetate titanate, and diisostearoyl ethylene titanate; phosphate-based titanium chelate compounds such as isopropyl tri(dioctyl phosphate)titanate, isopropyl tris(dioctyl biphosphate)titanate, tetraisopropyl bis(dioctyl phosphite)titanate, tetraoctyl bis(didodecyl phosphite)titanate, tetra(2,2-diallyloxymethyl-1-butyl)bis(dioctyl biphosphate)oxyacetate titanate, bis(dioctyl biphosphate)ethylene titanate; and other titanium chelate compounds such as isopropyl tridecyl benzenesulfonyl titanate and isopropyl bis(N-amide ethyl aminoethyl)titanate.

These coupling agents can be used singly or in combination.

The methods for surface-treating flame retardants with coupling agents are not particularly limited. The methods include, for example, (i) a method for adding coupling agents while dispersing flame retardants in an organic solvent to bring them into contact with each other, (ii) a method for dispersing flame retardants in an organic solvent and then adding coupling agents to bring them into contact with each other, or (iii) a method for dispersing flame retardants in an organic solvent containing coupling agents in advance to bring them into contact with each other. The usage of coupling agents is generally from 0.1 to 40 parts by weight and preferably from 0.5 to 30 parts by weight, per 100 parts by weight of flame retardants.

The surface treatment by contacting coupling agents with flame retardants may be performed while wet grinding the flame retardants. The wet grinding is preferably performed while stirring for the purpose of decreasing aggregation of the flame retardants.

The temperature for surface treating flame retardants with coupling agents is, but not particularly limited to, desirably, the boiling point of an organic solvent or below in terms of operation and safety. The surface treatment is generally performed until the aggregation of flame retardants is reduced, and desirably continued until secondary particles produced by the aggregation of primary particles of flame retardants have a diameter of generally 30 μm or less, preferably 25 μm or less, more preferably 20 μm or less. The diameter of the secondary particles is the value measured according to "Testing of Seeds, Method A" as stipulated in JIS K-5400.

The surface treatment of flame retardants with coupling agents is preferably performed in a mixed organic solvent consisting of a polar organic solvent and a non-polar organic solvent. Particularly, it is desirable to perform the surface treatment with coupling agents in the step for wet grinding the above described needle-like or whisker-like salt of basic nitrogen-containing compounds and phosphoric acid in a mixed organic solvent consisting of a polar organic solvent and a non-polar organic solvent to finely divide particles such that the particulate form characteristics are within a preferable range, at the same time as the finely-dividing step or after the finely-dividing step.

As a polar organic solvent and a non-polar organic solvent, those above described can be used. For the mixing ratio of the non-polar organic solvent with the polar organic solvent, the above described range can also be adopted.

The surface treatment of flame retardants with coupling agents in an organic solvent may provide flame retardant slurry having a reduced number of secondary aggregation particles.

The organic solvent can be removed from the flame retardant slurry, drying it, as necessary. The method includes, but not particularly limited to, for example, a method for separating the slurry into flame retardants and organic solvents by a filter cloth or the like in advance and then drying the flame retardants. The temperature for drying is not particularly limited as long as it is the temperature where flame retardants do not decompose and organic solvents volatilize. Drying device is not particularly limited, as long as the concern about ignition of organic solvents and dust explosion of flame retardants are prevented, and a one-pass oven or an inert-oven is used.

The loading of the flame retardants surface-treated with coupling agents is appropriately selected depending on intended use, and is generally from 0.1 to 50 parts by weight, preferably from 1 to 40 parts by weight, more preferably from 5 to 35 parts by weight, per 100 parts by weight of insulating resins.

5. Porous Substance

It is preferable to bring the slurry containing the surface-treated-flame retardants in an organic solvent into contact with porous substances after the surface treatment with coupling agents in terms of enhancing storage stability of varnish or curable compositions.

The porous substances include, for example, inorganic porous substances such as silica gel, diatomite, active alumina, magnesia, titania, silica-alumina, zeolite, molecular sieve, porous silicon, porous glass beads, activated clay, mica, kaolin, magnetite, ferrite, nickel oxide; and organic porous substances such as activated carbon, molecular sieving carbon, ion exchange resins. Among them, inorganic porous substances are preferred and silica gel is most preferred in terms of ease of separation from flame retardant slurry.

Silica gel has a pore diameter of preferably from 3 to 500 nm, more preferably from 5 to 100 nm, most preferably from 7 to 50 nm. The porous substances may be used singly or in combination.

The method for bringing porous substances into contact with flame retardant slurry includes, but not particularly limited to, for example, 1) a method for adding porous substances in flame retardant slurry, stirring and mixing, or 2) a method for passing flame retardant slurry through a filter composed of porous substances. More specifically, for example in the case of 1), the flame retardant slurry with porous substances being added therein may be left at rest or stirred. The method for stirring is not particularly limited, and may employ, for example, stirring with a glass rod, stirring with a stirrer and a magnetic stirrer, and stirring with an agitator or shaker. The shape of the stirrer or the blade for use in the agitator is not particularly limited.

The temperature of the contact treatment with porous substances is preferably from 5 to 70° C., more preferably from 15 to 50° C. If the treatment temperature is too low or too high, the performance of the flame retardant slurry may be reduced. The treatment time is preferably 5 hours or longer. If the treatment time is too short, the treatment effect by the porous substances may not be fully exerted.

The porous substances are separated after the contact in this manner. The method for separating the porous substances from flame retardant slurry may be performed in accordance with conventional methods, and includes, for example, filtration using filter papers, filter cloths, glass fibers, quarts, glass filters, filter dishes, silica fibers or the like as filter layers, decantation and the like. The filtration method is not particularly limited and treatment such as pressurization or suction may be applied for enhancing filtration efficiency.

The amount of the porous substances to be added is generally from 0.1 to 50 parts by weight, preferably from 0.5 to 40 parts by weight, per 100 parts by weight of the flame retardants in flame retardant slurry.

6. Flame Retardant Slurry

The above described flame retardant slurry is suitably used as flame retardants for obtaining varnish, curable compositions, insulation films and the like having a reduced amount of secondary aggregation particles of the flame retardants. The flame retardant slurry of the present invention comprises the flame retardants surface-treated with coupling agents and organic solvents.

The flame retardant slurry includes a) flame retardant slurry before removing organic solvents after the surface of flame retardants is treated with coupling agents in the organic solvents, b) flame retardant slurry in which organic solvents are further added to the above flame retardant slurry, c) flame retardant slurry in which a part of organic solvents is removed from the above flame retardant slurry, d) flame retardant slurry newly prepared by mixing the flame retardants with organic solvents, the flame retardants being obtained by surface treating with coupling agents, removing organic solvents and drying, and e) flame retardant slurry subjected to contact treatment of these flame retardant slurry with porous substances.

The organic solvent to compose the flame retardant slurry includes polar organic solvent and non-polar organic solvents similar to the above. The method for mixing the slurry is not particularly limited and includes, for example, a method in which an agitator having agitating blades or a wet dispersing machine is used.

In the flame retardant slurry according to the present invention, the concentration of the flame retardants in an organic solvent is not particularly limited, but typically from 5 to 80% by weight, preferably from 10 to 60% by weight, in terms of operability in preparation of vanish.

The flame retardant slurry according to the present invention has a secondary particle diameter of the particles present in the slurry of 30 μm or less, preferably 25 μm or less, more preferably 20 μm or less. Use of such slurry may easily provide varnish having reduced amount of secondary aggregation particles. The solid content of the flame retardant slurry is in the range where a desired amount of flame retardant may be formulated and may preferably range from 5 to 80% by weight, and the viscosity may preferably be 100 Pa·s or below in terms of workability.

7. Other Components

The curable composition and varnish according to the present invention may formulate other components depending on desire. As other components, it is preferable to formulate compounds having absorption in the wavelength region of laser beams used for forming, for example, holes such as via holes or through holes. Specifically, silica or the like is used when using carbon dioxide gas laser, and ultraviolet absorbing agents are used when using ultraviolet laser (for example, UV-YAG laser or the like). Use of curable compositions containing the compounds having absorption in the wavelength region of laser beams facilitates the formation of holes by lasers and reduces the occurrence of a smear.

Examples of ultraviolet absorbing agents include salicylic acid compounds such as phenyl salicylate, p-tert-butylphenyl salicylate, p-octylphenyl salicylate; benzophenone compounds such as 2,4-dihydroxybenzophenone, 2-hydroxy-4-methoxybenzophenone, 2-hydroxy-4-octoxybenzophenone, 2-hydroxy-4-dodecyloxybenzophenone, 2,2'-dihydroxy-4,-methoxybenzophenone, 2,2'-dihydroxy-4,4'-dimethoxybenzophenone, 2-hydroxy-4-methoxy-5-sulfobenzophenone, bis(2-hydroxy-4-methoxybenzoylphenyl)methane; benzotriazole compounds such as 2-(2'-hydroxy-5'-methylphenyl)benzotriazole, 2-(2'-hydroxy-5'-tert-butylphenyl)benzotriazole, 2-(2'-hydroxy-3',5'-di-tert-butylphenyl)-5-chlorobenzotriazole, 2-(2'-hydroxy-3',5'-di-tert-amylphenyl)benzotriazole, 2-[2'-hydroxy-3'-(3",4",5",6"-tetrahydrophthalimidemethyl)-5'-methylphenyl]benzotriazole, 2,2-methylenebis[4-(1,1,3,3-tetramethylbutyl)-6-(2H-benzotriazole-2-yl)phenol], 2-[2-hydroxy-3,5-bis($\alpha,\alpha$-dimethylbenzyl)phenyl]benzotriazole; benzoate compounds such as 2,4-di-tert-butlphenyl-3',5'-di-tert-butyl-4'-hydroxybenzoate; cyanoacrylate compounds such as 2-ethylhexyl-2-cyano-3,3'-diphenylacrylate and ethyl-2-cyano-3,3'-diphenylacrylate; hindered amine compounds such as bis(2,2,6,6-tetramethylpyperidinyl4)cebacate; organometallic compounds such as nickel bis(octylphenyl)sulfide and [2,2'-thiobis(4-tert-octylphenolate)]-n-butylamine nickel; inorganic compounds such as zinc oxide, tin oxide, titanium oxide, calcium carbonate, silica and clay; and the like. Among them, benzotriazole compounds are preferable in terms of being excellent in compatibility with insulating resins such as cycloaliphatic olefin polymers and stability during thermal curing.

The ultraviolet absorbing agents are formulated in an amount of generally from 0.1 to 30 parts by weight, preferably from 1 to 10 parts by weight, per 100 parts of insulating resins.

Additional components that may be used include flexible polymers (particularly preferred are epoxy resins that are in liquid form at room temperature such as hydrogenated bisphenol A-type liquid epoxy compounds), heat stabilizers, weathering stabilizers, antioxidants, leveling agents, antistatic agents, slip agents, antiblocking agents, antifog agents, lubricant, dye, pigment, natural oil, synthetic oil, wax, emulsion and fillers. The loadings may be appropriately selected within the range where objects of the present invention are not impaired.

In addition, as other components, thiol compounds or silane compounds may be formulated to improve insulation resistance and peeling resistance. The loading of the thiol compounds or silane compounds is generally from 0.01 to 30 parts by weight, preferably from 0.01 to 10 parts by weight, per 100 parts by weight of insulating resins. If the loading is too small, improvement effect of the insulation resistance and the peeling resistance will be small, and if too much, heat resistance and chemical resistance will tend to be reduced.

8. Curable Compositions

The curable compositions according to the present invention comprise insulating resins and flame retardants having particulate form. Preferably, the flame retardants are halogen-free flame retardants having particulate form.

Primary particles of the flame retardants have an average major axis from 0.01 to 5 μm, preferably from 0.03 to 3 μm; an aspect ratio (average major axis/average minor axis) of 5 or less, preferably 3 or less; and the particles having a major axis over 10 μm are included in 10% or less, preferably 5% or less, most preferably 1% or less by number. The flame retardants are preferably surface-treated with coupling agents. The halogen-free flame retardants are preferably phosphorus flame retardants, more preferably phosphorus flame retardants composed of the salt of basic nitrogen-containing compounds with phosphoric acid.

The curable compositions preferably contain curing agents. The curing agents preferably comprise nitrogen curing agents, more preferably halogen-free nitrogen curing agents, most preferably halogen-free isocyanulate curing agents having an allyl group and an epoxy group.

The insulating resins preferably include cycloaliphatic olefin polymers, epoxy resins, polyamide resins, aromatic polyether polymers, liquid crystal polymers and mixtures thereof.

The curable compositions may contain various formulation ingredients such as curing aids, ultraviolet absorbing agents, and flexible polymers as necessary.

The curable compositions according to the present invention are excellent in flame retardancy, insulation and adhesiveness, and do not generate hazardous substances such as halogen compounds on burning by using halogen-free flame retardants as flame retardants. Thus, the curable compositions according to the present invention are applicable to electrical insulating layers in multilayer circuit boards, semiconductor device interlayer insulator films, solder resists, spacers, cells or adhesives for liquid crystal display devices and the like.

The curable compositions have high flame retardancy when the particulate form of the flame retardants meet the above described characteristics, and capable of providing multilayer circuit boards having good electrical insulation.

The curable compositions may be molded into moldings having various shapes, and among the moldings, preferably molded into the shape of films or sheets. The films or sheets may be suitably used to form electrical insulating layers in multilayer boards. In addition, the varnish of the curable compositions may be used to form coating layers on the boards, and they are dried to form electrical insulating layers. The curable compositions are cured after applied for electrical insulating layers.

The curable compositions according to the present invention are generally used as the varnish in which each component is dissolved or dispersed in organic solvents when molding.

9. Varnish

The varnish according to the present invention is the varnish comprising insulating resins, flame retardants, various components and organic solvents, and broadly divided into two types, varnish (I) and varnish (II), in terms of whether the flame retardants are treated with coupling agents or not.

The varnish (I) according to the present invention is the varnish which comprises insulating resins, flame retardants and organic solvents, wherein the flame retardants are flame retardants in particulate form and whose primary particles have an average major axis from 0.01 to 5 μm, an aspect ratio of 5 or less, and the proportion of a major axis of more than 10 μm being at most 10% by number.

The flame retardants in particulate form are preferably halogen-free flame retardants, more preferably phosphorus flame retardants, most preferably phosphorus flame retardants composed of the salt of basic nitrogen-containing compounds and phosphoric acid. The flame retardants may be surface-treated with coupling agents to reduce secondary aggregation particles.

The varnish (I) preferably contains curing agents. The curing agents are preferably nitrogen-based curing agents, more preferably halogen-free nitrogen-based curing agents, most preferably halogen-free isocyanulate curing agents including an allyl group and an epoxy group. The varnish (I) may contain various components described above as necessary.

The varnish (II) according to the present invention is the varnish comprising insulating resins, curing agents, flame retardants and organic solvents, wherein the flame retardants are prepared by treating flame retardants in particulate form with coupling agents, and the varnish has secondary particles therein having a diameter of 30 μm or less.

In the varnish (II), the flame retardants in particulate form are preferably halogen-free flame retardants, more preferably phosphorus flame retardants, most preferably phosphorus flame retardants composed of the salt of basic nitrogen-containing compounds and phosphoric acid. The flame retardants in particulate form preferably have primary particles having an average major axis from 0.01 to 5 μm, an aspect ratio of 5 or less, and the proportion of a major axis of more than 10 μm being at most 10% by number. The varnish (II) may contain various components described above as necessary.

When halogen-free flame retardants, whose primary particles have an average major axis from 0.01 to 5 μm, an aspect ratio of 5 or less, and the proportion of a major axis of more than 10 μm being at most 10% by number, are used as flame retardants, the varnish (I) and varnish (II) according to the present invention include common components except that the former flame retardant is not surface-treated with coupling agents, while the latter flame retardant is surface-treated with coupling agents. Therefore, both will be described below as the varnish according to the present invention, except in the case where these varnish (I) and varnish (II) need to be described separately.

The varnish according to the present invention may be produced by mixing insulating resins, curing agents, flame retardants, other components to be formulated as necessary and organic solvents. When mixing each component, the flame retardants may be used in the form of flame retardant slurry. The flame retardant slurry may contain the flame retardants surface-treated with coupling agents.

The method for obtaining the varnish is not particularly limited. The temperature for mixing each component is preferably within the temperature where the reaction by the curing agents produces no ill effect to work, and preferably below the boiling point of the organic solvents to be used at the mixing, in terms of safety.

The organic solvents include aromatic hydrocarbon organic solvents such as toluene, xylene, ethylbenzene and trimethylbenzene; aliphatic hydrocarbon organic solvents such as n-pentane, n-hexane and n-heptane; cycloaliphatic hydrocarbon organic solvents such as cyclopentane and cyclohexane; halogenated hydrocarbon organic solvents such as chlorobenzene, dichlorobenzene and trichlorobenzene; ketone organic solvents such as methyl ethyl ketone, methyl isobutyl ketone, cyclopentanone and cyclohexanone; and the like. These organic solvents may be used singly or in combination.

Among these organic solvents, those preferred in terms of having good embedding properties for microscopic wiring and producing no blisters are mixed organic solvents prepared by mixing non-polar organic solvents such as aromatic hydrocarbon organic solvents and cycloaliphatic hydrocarbon organic solvents with polar organic solvents such as ketone organic solvents. The mixing ratio of non-polar organic solvents and polar organic solvents may be appropriately selected, and ranges generally from 5:95 to 95:5, preferably from 10:90 to 90:10, more preferably from 20:80 to 80:20, by weight ratio.

Usage of organic solvents is appropriately selected depending on objects such as thickness control or improvement of flatness, and generally the organic solvents are used in an amount enough for each component to be uniformly dissolved or dispersed. More specifically, the amount of organic solvents used in terms of solid content of the varnish ranges preferably from 5 to 70% by weight, more preferably from 10 to 65% by weight, most preferably from 20 to 60% by weight.

The method for mixing each component may be in accordance with conventional methods, and may include, for example, methods using agitation with a stirrer and a magnetic stirrer, a high speed homogenizer, a dispersion, a planetary stirring machine, a double spindle stirrer, a ball mill and a triple-roll.

The varnish (I) according to the present invention may be produced by using the slurry containing finely divided flame retardants that are obtained by wet grinding flame retardants in particulate form (preferably halogen-free flame retardants) in organic solvents (preferably mixed solvents consisting of non-polar organic solvents and polar organic solvents). In other words, the varnish (I) may be prepared by mixing the flame retardant slurry, insulating resins, curing agents and other components and as necessary diluting the mixture with organic solvents.

The varnish (II) according to the present invention may be produced by using the slurry containing flame retardants in particulate form (preferably halogen-free flame retardants) surface-treated with coupling agents and organic solvents. In other words, the varnish (II) may be prepared by mixing the flame retardant slurry, insulating resins, curing agents and other components and as necessary diluting the mixture with organic solvents. The slurry that may be used as the flame retardant slurry contains the flame retardants which are surface-treated with coupling agents in the step for finely dividing particles by wet grinding the flame retardants in particulate form (preferably halogen-free flame retardants) in organic solvents (preferably mixed solvents consisting of non-polar organic solvents and polar organic solvents) at the same time as a finely-dividing step or after the step.

10. Moldings

The varnish according to the present invention may be coated or cast on supports or substrates and dried to form moldings such as films, sheets and insulation films. The varnish may be impregnated in fabric base materials such as glass fibers and dried to obtain prepreg.

The varnish according to the present invention may be coated or cast on any support and dried, being molded into film or sheet form. The support includes resin films (carrier films) and metal foil.

When obtaining films or sheets as the moldings according to the present invention, the molding method is not particularly limited and preferably molded by a solution casting process or a melt casting process. In the solution casting process, varnish is coated on supports and then organic solvents are removed by drying.

The supports for use in the solution casting process include resin films (carrier films) and metal foil. Thermoplastic resin films are generally used for the resin films. Specifically, the resin films include polyethylene terephthalate films, polypropylene films, polyethylene films, polycarbonate films, polyethylene naphthalate films, polyallylate films and nylon films. Among these resin films, polyethylene terephthalate films and polyethylene naphthalate films are preferred in terms of having good heat resistance, chemical resistance and peeling properties after molding.

The metal foil includes, for example, copper foil, aluminum foil, nickel foil, chromium foil, gold foil and silver foil. Copper foil, particularly electrolytic copper foil or rolled copper foil, is preferred in terms of good electrical conductance and low cost.

The thickness of the supports is, but not particularly limited to, generally from 1 to 150 μm, preferably from 2 to 100 μm, more preferably from 3 to 50 μm, in terms of workability or the like.

Methods for coating include the methods such as dip coating, roll coating, curtain coating, die coating and slit coating. Conditions for removing and drying organic solvents are appropriately selected depending on types of organic solvents, in which drying temperature is generally from 20 to 300° C., preferably from 30 to 200° C., and drying time is generally from 30 seconds to 1 hour, preferably from 1 minute to 3 minutes.

The thickness of films or sheets may be appropriately determined depending on intended use, and is generally from 0.1 to 200 μm, preferably from 0.5 to 150 μm, more preferably from 10 to 100 μm. When the films or sheets are desired to be obtained by themselves, the films or sheets are formed on supports and then peeled from the supports.

The varnish according to the present invention may be impregnated in fiber base materials such as organic synthetic fibers or glass fibers and dried to form prepreg.

The varnish according to the present invention may be coated on substrates, dried and then cured to form insulation films.

11. Laminate (Multilayer Circuit Board)

The insulation films according to the present invention are cured products obtained by applying the varnish according to the present invention on any given substrates, drying and then curing. The insulation films are formed on substrates having conductor circuit layers, forming laminates. The laminates are preferably multilayer circuit boards.

Examples of the substrates having conductor circuit layers include inner layer substrates consisting of electrical insulating layer (A1) such as printed wiring substrates or silicon wafer substrates and conductor circuit layer (B1) formed on the surface thereof. The thickness of the inner layer substrates is generally from 50 μm to 2 mm, preferably from 60 μm to 1.6 mm, more preferably from 100 μm to 1 mm.

The materials of electrical insulating layer (A1) for composing the inner layer substrates are not limited as long as they are electrically insulating, and include those prepared by curing curable compositions containing, for example, cycloaliphatic olefin polymers, epoxy resins, maleimide resins, acrylic resins, diallylphthalate resins, triazine resins, aromatic polyether polymers, cyanate ester polymers and polyimide resins. The inner layer substrates may be those containing glass fibers, resin fibers and the like for improving strengths. The materials of conductor circuit layer (B1) composing the inner layer substrates are generally conductive metals.

The method for obtaining the electrical insulating layers and the laminates according to the present invention includes (1) a method for applying the varnish according to the present invention on the substrates having conductor circuit layers, removing organic solvents, drying and then curing it; and (2) a method for molding films or sheets by using the varnish according to the present invention, laminating the resultant films or sheets on the substrates having conductor circuit layers by heat-press or the like and then curing them. It is preferable to obtain the laminates by the method (2) in which films or sheets are used, in terms of capable of securing smoothness of electrical insulating layers and easily forming multiple layers.

The insulation films according to the present invention desirably do not have large particles of generally over 30 μm, preferably over 25 µm, more preferably over 20 µm, within a region of 500 µn square as confirmed by a scanning electronic microscope.

The thickness of the electrical insulating layers according to the present invention is generally from 0.1 to 200 µm, preferably from 1 to 150 µm, more preferably from 10 to 100 µm.

The method for applying the varnish (1) described above on the inner layer substrates is not particularly limited, and includes the method for applying the varnish according to the present invention on substrates with, for example, a die coater, a roll coater, a curtain coater or the like. After the varnish is applied on substrates, it is generally dried at a temperature of from 70 to 140° C. for 1 to 30 minutes, and further cured at a temperature of generally from 30 to 400° C., preferably 70 to 300° C., more preferably from 100 to 200° C. and at a condition of generally from 0.1 to 5 hours, preferably from 0.5 to 3 hours. This process can provide a laminate having insulation film (A2) formed on a substrate.

For laminating films or sheets on substrates by the above described method (2), generally, the films or sheets with supports are overlapped such that the films or sheets are brought into contact with the surface of inner layer substrates and subjected to thermo-compression bonding by using a pressure machine such as a pressure laminator, a press, a vacuum laminator, a vacuum press, and a roll laminator. The thermo-compression bonding is preferably performed under vacuum to improve embedding properties of wiring and suppress generation of blisters or the like. The temperature during the thermo-compression bonding is generally from 30 to 250° C., preferably from 70 to 200° C.; the strength of the compression bonding is generally from 0.01 to 20 MPa, preferably from 0.1 to 10 MPa; and the time of the compression bonding is generally from 30 seconds to 5 hours, preferably from 1 minute to 3 hours. The thermo-compression bonding is performed under vacuum by reducing the pressure of the atmosphere, and the condition of the reduced pressure is generally from 100 kPa to 1 Pa, preferably from 40 kPa to 10 Pa. Curing under similar conditions as described above after the thermo-compression bonding provides laminates having insulation film (A2).

When the above described films or sheets with supports are laminated on substrates, they may be cured with the supports, but generally cured after the supports are peeled off. The supports comprising conductive metal foil may also be applied as conductor circuit layer (B2) as it is, remaining a part or all of the metal foil.

Inner layer substrates are preferably pre-treated to improve the adhesive strength between the inner layer substrate and insulation film (A2). The method of pretreatment includes (i) a method for bringing alkaline sodium chlorite or permanganic acid into contact with the surface of the inner layer substrate to make the surface coarse, (ii) a method for oxidizing the surface by an alkaline aqueous solution of potassium persulfate or an aqueous solution of potassium sulfide-ammonium chloride and then reducing, (iii) a method for depositing plating at the conductor circuit part of the inner layer substrate to coarse the surface, and (iv) a method for forming a primer layer by triazine thiol compounds or silane compounds. Among them, the method for forming a primer layer by using triazine thiol compounds such as 2-di-n-butylamino-4,6-dimercapto-s-triazine is suitable in the case where copper is used for the conductor circuit, since it attains a high adhesiveness without corrosion of copper.

Thus, the insulation film according to the present invention [electrical insulating layer A2] is formed on the inner layer substrate to obtain a laminate with electrical insulating layer (A2) on the top thereof.

When the laminate is used for the final circuit board, the insulation film (A2) serves as a solder resist layer in the board.

Using the above described laminate further as the inner layer substrate, a new conductor circuit layer (B2) may be formed on the electrical insulating layer (A2) to obtain a multilayer circuit board. The multilayer circuit board has a laminate structure in which an electrical insulating layer (A3) comprising the insulation film according to the present invention is formed on the substrate having the conductor circuit layer (B2). Thus, the multilayer circuit board is also a laminate according to the present invention. The process for producing the multilayer circuit board is not particularly limited and includes, for example, a following process.

Openings for forming via holes are formed in the electrical insulating layer (A2), and then metal thin films are formed on the surface of the electrical insulating layer (A2) and the inner wall surface of the openings for forming via holes by a dry process (dry plating process) such as sputtering. Then, plated resists are formed on the metal thin films, and further thereon plated films are formed by wet plating such as electrolytic plating or the like. After the plated resists are removed, the conductor circuit (B2) consisting of metal thin films and electrolytically plated films is formed by etching. To enhance adhesive strength between the electrical insulating layer (A2) and the conductor circuit (B2), the surface of the electrical insulating layer (A2) may be brought into contact with a liquid such as permanganic acid or chromic acid, or subjected to plasma treatment.

The method for forming openings for forming via holes to connect the conductor circuit (B1) with the conductor circuit (B2) in the electrical insulating layer (A2) may be by physical treatment such as drill, laser or plasma etching or the like, or by so called photolithography in which the film for forming an electrical insulating layer by curing, which is the molding according to the present invention, is photo-cured by masking and then cured after the uncured part is removed. Among these methods, the method using laser such as carbon dioxide gas laser, excimer laser or UV-YAG laser is preferred, since it can form finer via holes without reducing the properties of the electrical insulating layer.

Similarly, holes such as through holes may be formed. The ratio of the inner diameter (d1) of the bottom part of the holes such as via holes or through holes to the inner diameter (d0) of the inlet (surface) part of the holes [hole diameter ratio: d1/d0×100 (%)] is generally 40% or more, preferably 50% or more, more preferably 65% or more. d0 is generally from 10 to 250 µm, preferably from 20 to 80 µm. Those having a large hole diameter ratio are highly reliable as multilayer circuit boards, since it hardly produces faulty electrical continuity between insulating layers.

In the above described circuit boards, a part of the conductor circuits may comprise a metal electrical source layer, a metal ground layer or a metal shield layer.

In the present invention, a plurality of additional electrical insulating layers (A3, A4 . . . ) and conductor circuit layers (B3, B4 . . . ) can be alternately laminated on the substrate obtained by forming electrical insulating layer (A2) and conductor circuit layer (B2), the substrate being used as a new inner layer substrate.

Multilayer circuit boards can be used as printed wiring boards for packaging semiconductor devices such as CPU and memory and other packaging components in electronic equipment such as computers and cellular phones. Particularly, those having fine pitch wiring are suitable for wiring boards for high-speed computers and portable terminals for use in high-frequency regions, as high-density printed wiring boards.

EXAMPLES

The present invention will now be described below in detail using examples and comparative examples. In these examples and comparative examples, parts and % are based on weight unless otherwise specified.

The method for measuring and evaluating physical properties and characteristics are as follows:

(1) Molecular Weight

Unless otherwise specified, molecular weight was determined in terms of polystyrene by gel permeation chromatography (GPC) using toluene as solvent.

(2) Hydrogenation Ratio and Carboxyl Group Content

The ratio of molar number of hydrogenated unsaturated bonds relative to the molar number of unsaturated bonds having existed in polymers before hydrogenation (hydrogenation ratio), and the ratio of the number of moles of maleic acid (anhydride) residue relative to the number of total monomer units in polymers (carboxyl group content) were measured by $^1$H-NMR spectrum.

(3) Glass Transition Temperature (Tg)

Tg was measured by differential scanning calorimetry (DSC).

(4) Average of Primary Particle Diameters of Fillers

Major axes of 1000 pieces of fillers were measured by a scanning electron microscope and the average of the obtained values was determined. In the same manner, the percentage of the particles having a major axis over 10 μm in the fillers was determined.

(5) Aspect Ratio of Fillers

Major axes and minor axes of 1000 pieces of fillers were measured respectively by a scanning electron microscope, and the average of the obtained values was calculated to determine the aspect ratio according to the following expression:

Aspect ratio=(average of major axes)/(average of minor axes)

(6) Evaluation of Secondary Particle Diameter i) Secondary Particle Diameters of Flame Retardants in Slurry and Varnish Secondary particle diameters of flame retardants present in slurry and varnish were measured according to "Testing of Seeds, Method A" as stipulated in JIS K-5400, and evaluated according to the following standard:

A: particle size is 20 μm or less,

B: particle size is from over 20 μm to 30 μm, and

D: particle size is over 30 μm.

ii) Secondary Particle Diameters of Flame Retardants in Insulation Films

With regard to secondary particle diameters of flame retardants present in insulation films (electrical insulating layers on boards), the insulation films were cut with ion focusing beam; the cross section was observed by a scanning electron microscope; and aggregates within a region of 500 μm square were observed and evaluated according to the following standard:

A: aggregates having a size of over 20 μm are not present,

B: aggregates having a size of over 20 μm to 30 μm are present, and

C: aggregates having a size of over 30 μm are present.

(7) Insulation i) Evaluation Method 1

Comb-shaped electrodes having a wiring width of 50 μm were formed on the second electrical insulating layer of a multilayer circuit board with a distance between the wiring of 50 μm. After that, they were left to stand under saturated steam conditions at 130° C. in a state where 10 V of direct current is being applied, and electric resistance was measured after 100 hours and evaluated according to the following standard:

A: electric resistance is $10^9 \Omega$ or more,

B: electric resistance is from $10^8 \Omega$ to less than $10^9 \Omega$,

C: electric resistance is less than $10^8 \Omega$ without a short-circuit, and

D: electric resistance is less than $10^8 \Omega$ with a short-circuit.

ii) Evaluation Method 2

Between the second layer and the third layer of electrical insulating layers of a multilayer circuit board, which has both-side total of six layers with three electrical insulating layers respectively on both sides of a core material, a pattern for solid conductor-line evaluation as stipulated in JPCA-BU01 was formed. After that, they were left to stand under saturated steam conditions at 120° C. in a state where 5.5 V of direct current is being applied, and electric resistance was measured after 100 hours and evaluated according to the following standard:

A: electric resistance is $10^9 \Omega$ or more,

B: electric resistance is from $10^8 \Omega$ to less than $10^9 \Omega$.

C: electric resistance is less than $10^8 \Omega$ without a short-circuit, and

D: electric resistance is less than $10^8 \Omega$ with a short-circuit.

(8) Low Dielectric Constant Characteristics

With regard to the low dielectric constant characteristics, relative dielectric constant ($\in$) was measured according to the method for measuring dielectric constants as stipulated in JPCA-BU01, and evaluated according to the following standard:

A: $\in$ is 3.3 or less,

B: $\in$ is from over 3.3 to 3.8,

C: $\in$ is from over 3.8 to 4.0, and

D: $\in$ is over 4.0.

(9) Variations of Dielectric Constant by Moisture Absorption

Dielectric constants both in the normal state and in a state where moisture is absorbed were measured according to the method for measuring dielectric constants as stipulated in JPCA-BU01.

The varnish used for producing multilayer circuit boards was applied on polyethylene terephthalate films having a smooth surface with a doctor blade, heated at 120° C. for 10 minutes for drying, and then left to stand in a nitrogen oven at 150° C. for 120 minutes to obtain an insulation film. The both surfaces of the electrical insulating film were deposited with aluminum to form a conductor, and then a base material for measurement having an example size of 40 μm as stipulated in JPCA-BU01 was prepared.

The dielectric constant in the normal state is the value measured after the base material for measurement was left to stand for 24 hours in the environment of a temperature of 21° C. and a relative humidity of 50%. The dielectric constant in the state where moisture is absorbed is the value measured after the base material for measurement was immersed for 24 hours in water having a temperature of 21° C.

The ratio of (dielectric constant in the state moisture is absorbed)/(dielectric constant in ordinary state) was calculated and evaluated according to the following standard:
A: the ratio is 1.05 or less,
B: the ratio is from over 1.05 to 1.1,
C: the ratio is from over 1.1 to 1.5, and
D: the ratio is over 1.5.

(10) Evaluation of Flame Retardancy

A Portion where No Conductor is Present in a Multilayer circuit board, which has a total of six layers for both sides with three electrical insulating layers respectively on both sides of a core material, was cut into a strip-form having a width of 13 mm and a length of 100 mm, preparing a specimen. Methane gas was burned with a Bunsen burner having a pipe diameter of 9.5 mm and a pipe length of 100 mm. The flame was adjusted to a length of 19 mm and brought into contact with the obtained specimen until the specimen is ignited. Immediately after the specimen is ignited, the flame was removed and the time duration when the specimen is burning was measured. Immediately after the fire of the specimen goes out, the flame was brought into contact with the specimen until it is ignited again. Immediately after the specimen is ignited for the second time, the flame was removed and the time duration when the specimen is burning was measured. The total of the burning time of the specimen for the first time and the burning time of the specimen for the second time was calculated, and was evaluated according to the following standard:
A: total burning time is 5 seconds or less,
B: total burning time is from over 5 seconds to 10 seconds, and
C: total burning time is over 10 seconds.

(11) Storage Stability of Varnish

Viscosity a immediately after the varnish is prepared and viscosity b after leaving the varnish to stand at 25° C. for 72 hours were respectively measured with E-type viscometer. The rate of viscosity rise was calculated from viscosity a and viscosity b and evaluated according to the following standard:
A: the rate of viscosity rise is 10% or less,
B: the rate of viscosity rise is from over 10% to 30%, and
C: the rate of viscosity rise is over 30%.

(12) Evaluation of the Flatness of Cured Products

With regard to the surface smoothness of cured products, a wiring board having a wiring thickness of 18 μm was cut and the thickness of the cured product layer was measured by a scanning electron microscope. The difference between the thinnest part and the thickest part was calculated and was evaluated according to the following standard:
A: the difference is 6 μm or less,
B: the difference is from over 6 μm to 8 μm, and
C: the difference is over 8 μm.

Example 1

Preparation Example of Finely Divided Melamine Polyphosphate Slurry A

Three hundred parts of melamine polyphosphate having primary particles having the particles with a major axis of more than 10 μm in 55%, an average major axis of 17 μm and an aspect ratio of 13 were added to a mixed solvent consisting of 1020 parts of xylene and 680 parts of cyclopentanone, and the mixture was stirred using an agitator with three blades in a 2 L separable flask, obtaining slurry of melamine polyphosphate (concentration of 15%). The resultant melamine polyphosphate slurry was dried and the melamine polyphosphate was observed by a scanning microscope, and found that the primary particles had the particles with a major axis of more than 10 μm in 55%, an average major axis of 17 μm and an aspect ratio of 13, which was similar to the raw material.

Two thousand parts of the resultant slurry were subjected to grinding treatment for 120 minutes while circulating with a residence time of 18 minutes using a horizontal wet-dispersing machine filled with zirconia beads of 0.4 mm in 83% by volume, obtaining finely divided melamine polyphosphate slurry A. The finely divided melamine polyphosphate slurry A was dried and the melamine polyphosphate was observed by a scanning microscope, and it was found that the primary particles had the particles with a major axis of more than 10 μm in 0.5%, an average major axis of 1.3 μm and an aspect ratio of 1.6. Secondary particles of the slurry A were evaluated to be over 30 μm.

Example 2

Preparation Example of Finely Divided Melamine Polyphosphate Slurry B

Two thousand parts of finely divided melamine polyphosphate slurry A and 12 parts of diisopropoxyaluminum monooleyl acetoacetate were added in separable flask and stirred for 15 minutes at 25° C. using an agitator with three blades, obtaining melamine polyphosphate slurry B surface-treated with a coupling agent. Secondary particles of the obtained slurry B were evaluated to be 20 μm or less (A).

Example 3

Preparation Example of Finely Divided Melamine Polyphosphate Slurry C

Three hundred parts of melamine polyphosphate having primary particles having the particles with a major axis of more than 10 μm in 55%, an average major axis of 17 μm and an aspect ratio of 13, 1020 parts of xylene, 680 parts of cyclopentanone and 12 parts of diisopropoxyaluminum monooleyl acetoacetate were subjected to grinding treatment for 60 minutes while circulating with a residence time of 18 minutes using a horizontal wet-dispersing machine filled with zirconia beads of 0.4 mm in 83% by volume, obtaining finely divided melamine polyphosphate slurry C.

The obtained melamine polyphosphate slurry was dried and the melamine polyphosphate was observed by a scanning microscope, and it was found that the primary particles had the particles with a major axis of more than 10 μm in 0.3%, an average major axis of 1.1 μm and an aspect ratio of 1.4. Secondary particles of the obtained slurry C were evaluated to be 20 μm or less (A).

Example 4

Preparation Example of Finely Divided Melamine Polyphosphate Slurry D

To 1000 g of melamine polyphosphate slurry B, 30 g of silica gel (Trade name: Wakogel C-300 HG, made by Wako Pure Chemicals Industries, Ltd., particle diameter of 40 to 60 μm, pore diameter of 7 nm) were added as a porous substance, and the mixture was left to stand for 24 hours at 25° C. Then, the porous substance was filtered out using a capsule filter (a final filter with fillers, pore diameter of 10 μm, made by ROKITECHNO Co., Ltd.), obtaining finely divided melamine polyphosphate slurry D.

Comparative Example 1

Preparation Example of Finely Divided Melamine Polyphosphate Slurry E

Grinding treatment was performed in a similar manner to Example 1 except that the mixed solvent in Example 1 was replaced by 1700 parts of xylene, obtaining melamine polyphosphate slurry E. The melamine polyphosphate slurry E was dried and the melamine polyphosphate was observed by a scanning microscope, and it was found that the primary particles had the particles with a major axis of more than 10 μm in 23%, an average major axis of 9 μm and an aspect ratio of 8.

Example 5

Preparation Example of a Multilayer Circuit Board

1. Synthesis of a Hydrogenated Product of Ring-opening Polymer 8-ethyl-tetracyclo[4.4.0.1$^{2,5}$.1$^{7,10}$]-dodec-3-ene was subjected to ring-opening polymerization, and then the resultant ring-opening polymer was subjected to hydrogenation reaction, obtaining a hydrogenated ring-opening polymer having a number average molecular weight (Mn) of 31,200, a weight average molecular weight (Mw) of 55,800, and a glass transition temperature (Tg) of about 140° C. Hydrogenation ratio of the hydrogenated product of ring-opening polymer was 99% or higher.

2. Synthesis of a Maleic Acid Modified Polymer

One hundred parts of the hydrogenated ring-opening polymer obtained as described above, 40 parts of maleic anhydride and 5 parts of dicumyl peroxide were dissolved in 250 parts of t-butylbenzene, and reacted at 140° C. for 6 hours. The resultant reaction solution was poured into 1000 parts of isopropyl alcohol to settle the reaction product, obtaining a maleic acid modified polymer. The modified polymer was vacuum dried for 20 hours at 100° C. The modified polymer had a molecular weight having a number average molecular weight (Mn) of 33,200 and a weight average molecular weight (Mw) of 68,300, and had a glass transition temperature (Tg) of about 170° C. The maleic acid group content was 25 mol %.

3. Preparation of Varnish

One hundred parts of the modified polymer described above, 50 parts of 1,3-diallyl-5-glycidyl isocyanurate, 5 parts of dicumyl peroxide, 200 parts of finely divided melamine polyphosphate slurry A (concentration of 15%), 5 parts of 2-[2-hydroxy-3,5-bis(α,α-dimethylbenzyl)phenyl]benzotriazole, 20 parts of liquid polybutadiene, and 0.1 part of 1-benzyl-2-phenylimidazole were dissolved in 64 parts of a mixed solvent consisting of 40 parts of xylene and 25 parts of cyclopentanone to prepare a varnish.

4. Preparation of a Film

The above described varnish was applied on a polyethylene naphthalate film (carrier film) of 300 mm square having a thickness of 40 μm using a die coater, and then dried at 100° C. for 10 minutes in a nitrogen oven, obtaining a dry film having a resin thickness of 45 μm with a carrier film.

5. Preparation of a Multilayer Circuit Board

On both sides of a double-sided copper-clad board (a core material obtained by impregnating a glass cloth with varnish containing glass fillers and halogen-free epoxy resins) having a thickness of 0.8 mm in which an inner layer circuit is formed, the inner layer circuit having a wiring width and a distance between the wiring of 50 μm respectively, a conductor thickness of 18 μm and a micro-etching treated surface, the above described dry films with carrier film were overlapped with the resin surfaces facing inside.

As a first press, this was subjected to thermo-compression bonding for 60 seconds under a reduced pressure of 200 Pa, at a temperature of 110° C. and a compression bonding strength of 0.5 MPa, using a vacuum lamination apparatus provided with heat resistant rubber press plates at the top and bottom. Then, as a second press, it was subjected to thermo-compression bonding for 60 seconds under a reduced pressure of 200 Pa, at a temperature of 140° C. and a compression bonding strength of 1.0 MPa, using a vacuum lamination apparatus provided with heat resistant rubber press plates covered with metal press plates at the top and bottom. Subsequently, only the polyethylene naphthalate film was peeled off, and the remaining part was left to stand for 120 minutes in a nitrogen oven of 150° C., obtaining a laminate having electrical insulating layers formed on an inner layer board.

In the portion of an electrical insulating layer of the obtained laminate, via holes for interlayer connection having a diameter of 30 μm were formed using a UV-YAG laser. Then, the laminate was washed, dried and exposed to argon plasma of 1000 W for 10 minutes.

The laminate was subjected to copper sputtering, and a thin film of copper having a thickness of 0.1 μm was formed on the wall surfaces of the via holes and the whole surface of the laminate.

A commercially available photosensitive dry film was applied on the surface of the laminate by thermo-compression bonding, and the dry film was exposed to light with a mask having a specific pattern thereon and was developed, obtaining a resist pattern. Electrolytic copper plating was applied on a resist non-formed portion to form an electrolytically copper-plated film having a thickness of 12 μm. Then, the resist pattern was stripped and removed with a stripping liquid, and a sputter copper thin film hidden under a resist formed portion was removed with a mixed solution of cupric chloride and hydrochloric acid to form a wiring pattern. Finally, the laminate was subjected to annealing at 170° C. for 30 minutes, obtaining a circuit board.

A conductor layer pretreatment solution was obtained by dissolving 0.1 part of 2-dibutylamino-4,6-dimercapto-S-triazine into 100 parts of isopropyl alcohol. The above described circuit board was immersed in the conductor pretreatment solution at room temperature for one minute, and then dried at 90° C. for 15 minutes. Electrical insulating layers and conductor layers were alternately formed in a similar manner as described above by using the treated circuit board as an inner layer circuit board, obtaining a multilayer circuit board having total 6 layers on both sides. The results of the evaluation are shown in Table 1.

Comparative Example 2

Preparation Example of a Multilayer Circuit Board

1. Preparation of Melamine Polyphosphate Slurry F

Thirty parts of melamine polyphosphate having primary particles having the particles with a major axis of more than 10 μm in 55%, an average major axis of 17 μm and an aspect ratio of 13 were added to a mixed solvent consisting of 102 parts of xylene and 68 parts of cyclopentanone, obtaining melamine polyphosphate slurry F having a concentration of 15%.

2. Preparation of a Multilayer Circuit Board

A multilayer circuit board was obtained in a similar manner to Example 5 except that finely divided melamine polyphosphate slurry A was replaced by the above described melamine polyphosphate slurry F. The results of the evaluation are shown in Table 1.

Comparative Example 3

Preparation Example of a Multilayer Circuit Board

A multilayer circuit board was obtained in a similar manner to Example 5 except that finely divided melamine polyphosphate slurry A was replaced by melamine polyphosphate slurry E. The results of the evaluation are shown in Table 1.

TABLE 1

|  | Dielectric constant (low dielectric constant characteristics) | Electrical insulation (Evaluation method 1) | Flame retardancy |
| --- | --- | --- | --- |
| Example 5 | A | A | A |
| Comp. Exam. 2 | A | D | C |
| Comp. Exam. 3 | A | D | C |

As apparent from the results of the comparison between Example 5 and Comparative Examples 2 and 3 shown in Table 1, a multilayer circuit board having a low dielectric constant and excellent in insulation and flame retardancy can be obtained by using a halogen-free flame retardant having primary particles which have an average major axis from 0.01 to 5 μm and an aspect ratio of 5 or less, wherein the particles with a major axis of more than 10 μm are included in 10% or less by number (Example 5).

Example 6

Preparation Example of a Multilayer Circuit Board

1. Synthesis of an Insulating Resin

Similar to Example 5, 8-ethyl-tetracyclo[4.4.0.1$^{2,5}$.1$^{7,10}$]-dodec-3-ene was subjected to ring-opening polymerization, and then the resultant ring-opening polymer was hydrogenated. The hydrogenated ring-opening polymer thus obtained was modified with maleic anhydride similar to Example 5 to synthesize a maleic acid-modified polymer having a maleic acid-group content of 25 mole %.

2. Preparation of Varnish

One hundred parts of the above described modified polymer, 50 parts of 1,3-diallyl-5-glycidyl isocyanurate, 5 parts of dicumyl peroxide, 200 parts of finely divided melamine polyphosphate slurry B, 5 parts of 2-[2-hydroxy-3,5-bis(α,α-dimethylbenzyl)phenyl]benzotriazole, 20 parts of a hydrogenated bisphenol A-type epoxy resin (Trade name: EPICLON EXA-7015, made by Dainippon Ink and Chemicals Incorporated, epoxy equivalent=210 g), and 0.1 part of 1-benzyl-2-phenylimidazole were dissolved in 65 parts of a mixed solvent consisting of 40 parts of xylene and 25 parts of cyclopentanone to prepare a varnish.

Slurry B of the finely divided melamine polyphosphate used herein comprises a finely divided melamine polyphosphate surface-treated with coupling agents.

3. Preparation of a film

The above described varnish was applied on a polyethylene naphthalate film (carrier film) of 300 mm square having a thickness of 40 μm using a die coater, and then dried at 120° C. for 10 minutes in a nitrogen oven, obtaining a dry film having a resin thickness of 45 μm with a carrier film.

4. Preparation of a Multilayer Circuit Board 0.1% by weight solution of 2-di-n-butylamino-4,6-dimercapto-s-triazine in isopropyl alcohol was prepared. In this solution, a both-sided copper-clad board (a core material obtained by impregnating a glass cloth with varnish containing glass fillers and halogen-free epoxy resins) having a thickness of 0.8 mm in which an inner layer circuit is formed, the inner layer circuit having a wiring width and a distance between the wiring of 50 μm respectively, a conductor thickness of 18 μm and a micro-etching treated surface, was immersed at 25° C. for one minute, and then dried in a nitrogen-replaced oven at 90° C. for 15 minutes to form a primer layer, obtaining an inner layer board.

To both sides of the inner layer board, the above described dry films with carrier film were overlapped with the resin surfaces facing inside. As a first press, this was subjected to thermo-compression bonding for 60 seconds under a reduced pressure of 200 Pa, at a temperature of 110° C. and a pressure of 0.5 MPa, using a vacuum laminator provided with heat resistant rubber press plates at the top and bottom. Then, as a second press, it was subjected to thermo-compression bonding for 60 seconds under a reduced pressure of 200 Pa, at a temperature of 140° C. and a pressure of 1.0 MPa, using a vacuum laminator provided with heat resistant rubber press plates covered with metal press plates at the top and bottom. Subsequently, only the polyethylene naphthalate film was peeled off, and the remaining part was left to stand for 120 minutes in a nitrogen oven of 150° C., obtaining a laminate having electrical insulating layers formed on an inner layer board (circuit board).

In the portion of an electrical insulating layer of the obtained circuit board, via holes for interlayer connection having a diameter of 30 μm were formed using third harmonic of a UV-YAG laser.

The circuit board in which via holes are formed was exposed to argon plasma of a frequency of 13.56 MHz, an output of 100 W and a gas pressure of 0.8 Pa for 10 minutes while maintaining a board surface temperature of about 130° C.

The plasma-treated circuit board was subjected to nickel sputtering at an output of 500 W and a gas pressure of 0.8 Pa to form a nickel film having a thickness of 0.1 μm. Then, it was subjected to copper sputtering at an output of 500 W and a gas pressure of 0.8 Pa to form a copper thin film having a thickness of 0.3 μm, obtaining a circuit board having a metal thin film.

A commercially available photosensitive dry film was applied on the surface of the circuit board by thermo-compression bonding, and the dry film was exposed to light with a mask having a specific pattern thereon and was developed, obtaining a resist pattern. Then, electrolytic copper plating was applied on a resist non-formed portion to form an electrolytically copper-plated film having a thickness of 18 μm. After that, the resist pattern was stripped and removed with a stripping liquid, and the board was subjected to etching treatment with a mixed solution of cupric chloride and hydrochloric acid to form a wiring pattern consisting of a metal thin film and an electrolytically copper-plated film. Finally, a multilayer circuit board with two layered-wiring patterns on both sides thereof was obtained by subjecting to annealing at 170° C. for 30 minutes.

Electrical insulating layers and conductor layers were alternately formed in a similar manner as described above by using the multilayer circuit board with two layered-wiring patterns on both sides thereof as a first layer, obtaining a multilayer circuit board having total 6 layers on both sides. The results of the evaluation are shown in Table 2.

Example 7

Preparation Example of a Multilayer Circuit Board

A multilayer circuit board was obtained in a similar manner to Example 6 except that finely divided melamine polyphosphate slurry B was replaced by melamine polyphosphate slurry C. The finely divided melamine polyphosphate slurry C herein used comprises finely divided melamine polyphosphate surface-treated with coupling agents. The results of the evaluation are shown in Table 2.

Example 8

Preparation Example of a Multilayer Circuit Board

A multilayer circuit board was obtained in a similar manner to Example 6 except that 100 parts of a modified polymer were replaced by a mixture of 30 parts of an epoxy resin (made by Tohto Chemical Industry Co., Ltd., YD-7011) and 30 parts of a polyamide resin (made by Henkel Hakusui Corp., Macrometer 6217). The results of the evaluation are shown in Table 2.

TABLE 2

| Examples | Testing of grains in varnish (secondary particle diameter) | Secondary particle diameter in electrical insulating layer | Electrical insulation (Evaluation method 2) | Variations of dielectric constant by moisture absorption | Flame retardancy |
|---|---|---|---|---|---|
| Exam. 6 | A | A | A | A | A |
| Exam. 7 | A | A | A | A | A |
| Exam. 8 | A | A | C | C | A |

As apparent from the results shown in Table 2, use of flame retardants which are surface-treated with coupling agents (Examples 6 through 8) can provide multilayer circuit boards in which aggregation of flame retardants is suppressed; secondary particles in varnish and electrical insulating layers are small; excellent electrical insulation is shown at a severe electrical insulation test; and variations of dielectric constant are small.

Example 9

Preparation Example of a Multilayer Circuit Board

A multilayer circuit board was obtained in a similar manner to Example 6 except that 100 parts of a modified polymer were replaced by a mixture of 30 parts of an epoxy resin (made by Tohto Chemical Industry Co., Ltd., YD-7011) and 30 parts of a polyamide resin (made by Henkel Hakusui Corp., Macrometer 6217), and finely divided melamine polyphosphate slurry B was replaced by finely divided melamine polyphosphate slurry A which was not surface-treated with coupling agents.

The obtained multilayer circuit board showed excellent flame retardancy. However, the variations of dielectric constant by moisture absorption showed a value of over 1.5 in the ratio of (dielectric constant in the state where moisture is absorbed)/(dielectric constant in the normal state). In addition, in the electrical insulating layer, some of the secondary particles of a flame retardant had a diameter of over 30 μm, and the electrical insulation under severe conditions by the evaluation method 2 was not sufficient.

By comparing this result with the results from Examples 6 through 8 (Table 2), it is understood that the flame retardant surface-treated with coupling agents shows superior characteristics to those non-treated.

Example 10

Preparation Example of a Multilayer Circuit Board

1. Preparation of Varnish

One hundred parts of a modified polymer obtained in a similar manner to Example 5, 37.5 parts of bisphenol A bis(propyleneglycol glycidyl ether)ether, 12.5 parts of 1,3-diallyl-5-(2-hydroxy-3-phenoxypropyl)-1,3,5-triazine-2,4,6 (1H,3H,5H)-trione, 6 parts of dicumyl peroxide, 200 parts of finely divided melamine polyphosphate slurry D, 5 parts of 2-[2-hydroxy-3,5-bis(α,α-dimethylbenzyl)phenyl]benzotriazole, and 0.1 part of 1-benzyl-2-phnylimidazol were dissolved in a mix organic solvent consisting of 120 parts of xylene and 80 parts of cyclopentanone, obtaining varnish.

The finely divided melamine polyphosphate slurry D used herein is prepared by subjecting to contact treatment with porous substances. The obtained varnish was evaluated for the storage stability. The results of the evaluation are shown in Table 3.

2. Preparation of a Film

The varnish was left to stand at 25° C. for 72 hours, and then was applied on a polyethylene naphthalate film (carrier film) of 300 mm square having a thickness of 40 μm using a die coater, followed by drying at 120° C. for 10 minutes in a nitrogen oven, obtaining a dry film having a resin thickness of 45 μm with a carrier film.

3. Preparation of a Multilayer Circuit Board 0.1% by weight solution of 2-di-n-butylamino-4,6-dimercapto-s-triazine in isopropyl alcohol was prepared. In this solution, a both-sided copper-clad board (a core material obtained by impregnating a glass cloth with varnish containing glass fillers and halogen-free epoxy resins) having a thickness of 0.8 mm, in which an inner layer circuit is formed having a wiring width and a distance between the wiring of 50 μm respectively, a conductor thickness of 18 μm and a microetching treated surface, was immersed at 25° C. for one minute, and then dried in a nitrogen-replaced oven at 90° C. for 15 minutes to form a primer layer, obtaining an inner layer board.

To both sides of the above described inner layer board, the above described dry films with carrier film were overlapped with the resin surfaces facing inside. As a first press, this was subjected to thermo-compression bonding for 60 seconds under a reduced pressure of 200 Pa, at a temperature of 110° C. and a pressure of 0.5 MPa, using a vacuum laminator provided with heat resistant rubber press plates at the top and bottom. Then, as a second press, it was subjected to thermo-compression bonding for 60 seconds under a reduced pressure of 200 Pa, at a temperature of 140° C. and a pressure of 1.0 MPa, using a vacuum laminator provided with heat resistant rubber press plates covered with metal press plates at the top and bottom. Subsequently, only the polyethylene naphthalate film was peeled off, and the remaining part was left to stand in a nitrogen oven at 140° C. for 30 minutes and then at 170° C. for 60 minutes, obtaining a laminate having electrical insulating layers formed on an inner layer board (circuit board).

On specific positions of the obtained circuit board, via holes for interlayer connections and terminal exposure having a diameter of 40 μm were formed with a UV-YAG laser beam machine (MODEL 5310: made by Electoro Scientific Industries, Inc.) using an aperture of 38 μm, with processing conditions of a frequency of 40 kHz and an output of 0.6 W and the number of shots of 40.

The circuit board with via holes was exposed to argon plasma of a frequency of 13.56 MHz, an output of 100 W and a gas pressure of 0.8 Pa for 10 minutes while maintaining a board surface temperature of about 130° C.

The plasma-treated circuit board was subjected to nickel sputtering at an output of 500 W and a gas pressure of 0.8 Pa to form a nickel film having a thickness of 0.1 μm. Then, it was subjected to copper sputtering at an output of 500 W and a gas pressure of 0.8 Pa to form a copper thin film having a thickness of 0.3 μm, obtaining a laminate having a metal thin film (circuit board).

A commercially available photosensitive dry film was applied on the surface of the circuit board by thermo-compression bonding, and the dry film was exposed to light with a mask having a specific pattern thereon and was developed, obtaining a resist pattern. Electrolytic copper plating was applied on a resist non-formed portion to form an electrolytically copper-plated film having a thickness of 18 μm. The resist pattern was stripped and removed with a stripping liquid, and the board was subjected to etching treatment with a mixed solution of cupric chloride and hydrochloric acid to form a wiring pattern consisting of a metal thin film and an electrolytically copper-plated film. Finally, a multilayer circuit board with two layered-wiring patterns on both sides thereof was obtained by subjecting to annealing at 170° C. for 30 minutes. The flatness of the multilayer circuit board was evaluated. The results of the evaluation are shown in Table 3.

Example 11

Preparation Example of a Multilayer Circuit Board

A multilayer circuit board was obtained in a similar manner to Example 10 except that 100 parts of a modified polymer were replaced by a mixture of 30 parts of an epoxy resin (made by Tohto Chemical Industry Co., Ltd., YD-7011) and 30 parts of a polyamide resin (made by Henkel Hakusui Corp., Macrometer 6217). The results of the evaluation are shown in Table 3.

TABLE 3

| | Storage stability of varnish | Flatness of cured product layer |
| --- | --- | --- |
| Example 10 | A | A |
| Example 11 | A | B |

From the results in Table 3, it is understood that the rise of the viscosity of varnish is suppressed by bringing the varnish into contact with porous substances, thereby stably obtaining films excellent in flatness even after a long period of storage.

INDUSTRIAL APPLICABILITY

In accordance with the curable compositions according to the present invention, multilayer circuit boards having high adhesiveness and excellent insulation can easily be obtained. The curable compositions according to the present invention do not generate halogen-based hazardous substances on burning and are excellent in environmental safety. The curable compositions according to the present invention is also excellent in flame retardancy, so that the multilayer circuit boards obtained by using these curable compositions can be used as printed wiring boards for packaging semiconductor devices such as CPU and memory and other packaging components in electronic equipment such as computers and cellular phones. Particularly, those having fine pitch wiring are suitable for wiring boards for high-speed computers and portable terminals for use in high-frequency regions, as high-density printed wiring boards.

The curable compositions according to the present invention can be immersed in fiber base materials such as glass fibers and resin fibers (aramid fibers) to obtain prepreg. The prepreg is applicable to modular boards and antenna boards compliant with cellular phones (2.4 GHz) and ITS (5.8 GHz). Further, the prepreg is applicable also to buildup condensers by laminating it on alumina boards.

By using the varnish according to the present invention, multilayer circuit boards less susceptible to environmental variations and excellent in insulation can easily be obtained. The multilayer circuit boards obtained by using the varnish according to the present invention have excellent flame retardancy, so that they can be used as printed wiring boards for packaging semiconductor devices such as CPU and memory and other packaging components in electronic equipment such as computers and cellular phones. Contact of the varnish with porous substances can improve the storage stability of the varnish.

The invention claimed is:

1. A varnish comprising: an insulating resin, a curing agent, a halogen-free flame retardant, and an organic solvent; wherein: (a) the halogen-free flame retardant is a particulate material, present as both primary particles and secondary aggregation particles, surface-treated with a metal chelate coupling agent; (b) the primary particles feature an average major axis length of from 0.01 to 5 μm; (c) the secondary aggregation particles feature a diameter of 30 μm or less; and (d) the curing agent comprises a nitrogen-containing compound and a peroxide curing aid.

2. The varnish according to claim 1, wherein the halogen-free flame retardant comprises a phosphorus-containing compound.

3. The varnish according to claim 2, wherein the phosphorous-containing compound comprises a salt of a basic nitrogen-containing compound and phosphoric acid.

4. The varnish according to claim 1, wherein the insulating resin is at least one selected from the group consisting of cycloaliphatic olefin polymers, epoxy resins, polyamide resins, aromatic polyether polymers, benzocyclobutene polymers, cyanate ester polymers, polyimide resins and liquid crystal polymers.

5. A molding obtained by a process comprising the steps of: coating or casting the varnish according to claim 1 on a support or substrate; and drying the varnish.

6. The molding according to claim 5, wherein the dried varnish yields a molding in the form of a film or sheet.

7. A molding obtained by a process comprising the steps of: coating or casting the varnish according to claim 1 on a support or substrate; drying the varnish; and curing the dried varnish; wherein the cured varnish yields a molding in the form of an insulation film.

8. A laminate comprising at least one electrical insulating layer formed on a substrate having a conductor circuit layer; wherein said laminate is obtained by a process comprising the steps of: coating or casting the varnish according to claim 1 on said substrate; drying the varnish; and curing the dried varnish.

9. A laminate comprising at least one electrical insulating layer formed on a substrate having a conductor circuit layer; wherein said laminate is obtained by a process comprising the steps of: coating or casting the varnish according to claim 1 on a support; drying the varnish, yielding a molding in the form of a film or sheet; thermo-compression bonding the film or sheet to said substrate to; and curing the film or sheet.

* * * * *